(12) United States Patent
Jeong et al.

(10) Patent No.: US 10,777,274 B2
(45) Date of Patent: Sep. 15, 2020

(54) SEMICONDUCTOR MEMORY SYSTEM WITH RESISTIVE VARIABLE MEMORY DEVICE HAVING SCHEDULER FOR CHANGING GENERATION PERIOD OF COMMAND AND DRIVING METHOD THEREOF

(71) Applicant: SK hynix Inc., Icheon (KR)

(72) Inventors: Seung-Gyu Jeong, Icheon (KR); Jung-Hyun Kwon, Seoul (KR); Won-Gyu Shin, Icheon (KR); Do-Sun Hong, Icheon (KR)

(73) Assignee: SK hynix Inc., Icheon (KR)

( * ) Notice: Subject to any disclaimer, the term of this patent is extended or adjusted under 35 U.S.C. 154(b) by 104 days.

(21) Appl. No.: 16/029,088

(22) Filed: Jul. 6, 2018

(65) Prior Publication Data

US 2019/0130972 A1    May 2, 2019

(30) Foreign Application Priority Data

Oct. 27, 2017 (KR) .................. 10-2017-0141358

(51) Int. Cl.
*G11C 13/00* (2006.01)
*G06F 3/06* (2006.01)
(Continued)

(52) U.S. Cl.
CPC ........ *G11C 13/0069* (2013.01); *G06F 3/0611* (2013.01); *G06F 3/0659* (2013.01); *G06F 3/0679* (2013.01); *G11C 7/1006* (2013.01); *G11C 7/22* (2013.01); *G11C 7/222* (2013.01); *G11C 13/0004* (2013.01); *G11C 13/0061* (2013.01); *G11C 13/0097* (2013.01); *G11C 29/12015* (2013.01); *G11C 29/36* (2013.01); *G11C 29/46* (2013.01); *G11C 11/5678* (2013.01); *G11C 2207/229* (2013.01); *G11C 2213/72* (2013.01)

(58) Field of Classification Search
CPC . G11C 13/0069; G11C 13/0061; G11C 7/222; G11C 13/0097; G11C 29/46
See application file for complete search history.

(56) References Cited

U.S. PATENT DOCUMENTS 9,576,658 B2    2/2017   Chen
2006/0190672 A1*   8/2006   Fuji .................. G11C 7/1006
                                                            711/100
(Continued)

FOREIGN PATENT DOCUMENTS

KR    10-1416834 B1    7/2014

*Primary Examiner* — Mushfique Siddique

(57) ABSTRACT

A semiconductor memory system including a resistive variable memory device and a driving method thereof are provided. The semiconductor memory system includes a memory controller including a scheduler configured to determine a generation period of a write command; a memory device including a memory cell array, the memory device being configured to write data input from the memory controller in the memory cell array in response to the write command; and a data determination circuit configured to output a change signal to the scheduler when all logic levels of the input data are equal to each other, the scheduler changing the generation period of the write command in response to the change signal.

13 Claims, 17 Drawing Sheets

(51) Int. Cl.
*G11C 29/12* (2006.01)
*G11C 7/22* (2006.01)
*G11C 7/10* (2006.01)
*G11C 29/36* (2006.01)
*G11C 29/46* (2006.01)
*G11C 11/56* (2006.01)

(56) References Cited

U.S. PATENT DOCUMENTS

| | | | |
|---|---|---|---|
| 2015/0363257 A1* | 12/2015 | Kwon | G11C 13/0035 |
| | | | 714/6.11 |
| 2016/0231961 A1* | 8/2016 | Shin | G06F 3/0629 |
| 2017/0102884 A1* | 4/2017 | Kim | G06F 3/0613 |
| 2017/0344278 A1* | 11/2017 | Hong | G11C 16/349 |
| 2017/0352403 A1* | 12/2017 | Lee | G11C 7/1042 |
| 2018/0108411 A1* | 4/2018 | Park | G11C 13/0069 |
| 2018/0182456 A1* | 6/2018 | Rangan | H01L 45/1286 |
| 2019/0079702 A1* | 3/2019 | Yeon | G06F 3/0679 |
| 2019/0146871 A1* | 5/2019 | Jeong | G06F 11/1048 |
| | | | 714/764 |

\* cited by examiner

SEMICONDUCTOR MEMORY SYSTEM WITH RESISTIVE VARIABLE MEMORY DEVICE HAVING SCHEDULER FOR CHANGING GENERATION PERIOD OF COMMAND AND DRIVING METHOD THEREOF

CROSS-REFERENCES TO RELATED APPLICATION

The present application claims priority under 35 U.S.C. § 119(a) to Korean Patent Application Number 10-2017-0141358, filed on Oct. 27, 2017, in the Korean Intellectual Property Office, which is incorporated herein by reference in its entirety.

BACKGROUND

1. Technical Field

Various embodiments generally relate to a semiconductor system and a driving method thereof, and more particularly, to a semiconductor memory system with a resistive variable memory device including a phase-change resistive layer, and to a driving method thereof.

2. Related Art

As memory devices with high capacity and low power consumption have been demanded, research is being conducted on next-generation memory devices that are non-volatile and that do not require refresh operations.

Next-generation memory devices generally require the high capacity of dynamic random access memories (DRAMs), the non-volatile characteristic of flash memories, and the high speed of static random access memories (SRAMs).

The next-generation memory devices may include variable resistive memory devices such as a phase-change RAM (PCRAM), a nano floating gate memory (NFGM), a polymer RAM (PoRAM), a magnetic RAM (MRAM), a ferroelectric RAM (FeRAM), a resistive RAM (ReRAM), and the like.

SUMMARY

Embodiments relate to a semiconductor memory system with a reduced operating time.

In an embodiment of the present disclosure, a semiconductor memory system may include: a data determination circuit configured to output a change signal based on logic levels of input data; and a scheduler configured to change a generation period of a write command in response to the change signal.

In an embodiment of the present disclosure, a semiconductor memory system may include: a memory controller including a scheduler configured to determine a generation period of a write command; a memory device including a memory cell array, the memory device being configured to write data input from the memory controller in the memory cell array in response to the write command; and a data determination circuit configured to output a change signal to the scheduler when all logic levels of the input data are equal to each other, the scheduler changing the generation period of the write command in response to the change signal.

The data determination circuit may be included in the memory device and the data determination circuit may include a reset determination circuit configured to output the change signal in response to a reset recovery time when each of the input data has a first logic level.

The data determination circuit may be included in the memory device and the data determination circuit may include a set determination circuit configured to output the change signal in response to a reset recovery time when each of the input data has a second logic level.

The data determination circuit may be included in the memory device and include a reset determination circuit configured to output a first change signal when each of the input data has a first logic level; a set determination circuit configured to output a second change signal when each of the input data has a second logic level; and a change signal output circuit configured to output the change signal in response to a reset recovery time when any one of the first and second change signals is enabled.

The data determination circuit may further include a selective blocking circuit configured to, when the input data are currently input data, block the transfer of the currently input data to the memory cell array when previously input data stored in the memory cell array are identical with the currently input data.

The semiconductor memory system may further include a data generation circuit configured to generate to generate the input data having logic levels equal to each other in response to a test mode signal generated from the memory controller.

In an embodiment of the present disclosure, a semiconductor memory system may include: a dual inline memory module (DIMM) including at least one phase-change memory module, the phase-change memory module being configured to have a set resistance state and a reset resistance state and to perform a memory operation; a memory controller configured to transfer a write command and input data to the phase-change memory module; and a data determination circuit configured to provide a change signal to the memory controller when all logic levels of the input data are equal to each other, the memory controller controlling a generation period of the write command input to the phase-change memory module in response to the change signal.

In an embodiment of the present disclosure, a driving method of a semiconductor memory system may include: providing input data to be written in a plurality of memory cells in a memory device, each of phase-change material layers in the plurality of memory cells being in any of a set resistance state and a reset resistance state when the input data is written in the plurality of memory cells; and setting a generation period of a write command based on a crystallization time when all logic levels of the input data are equal to each other, the crystallization time being a time the phase-change material layer takes to be in the reset resistance state.

These and other features, aspects, and embodiments are described below in the section entitled "DETAILED DESCRIPTION"

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present disclosure will be described in greater detail with reference to the accompanying drawings. The drawings are schematic illustrations of various embodiments. As such, embodiments include variations with respect to the configurations and shapes of the illustrations. Thus, the described embodiments should not be construed as being limited to the particular configurations and shapes illustrated herein but may include deviations in configurations and shapes, which do not depart from the spirit and scope of the present invention as defined in the appended claims.

Figure 1:
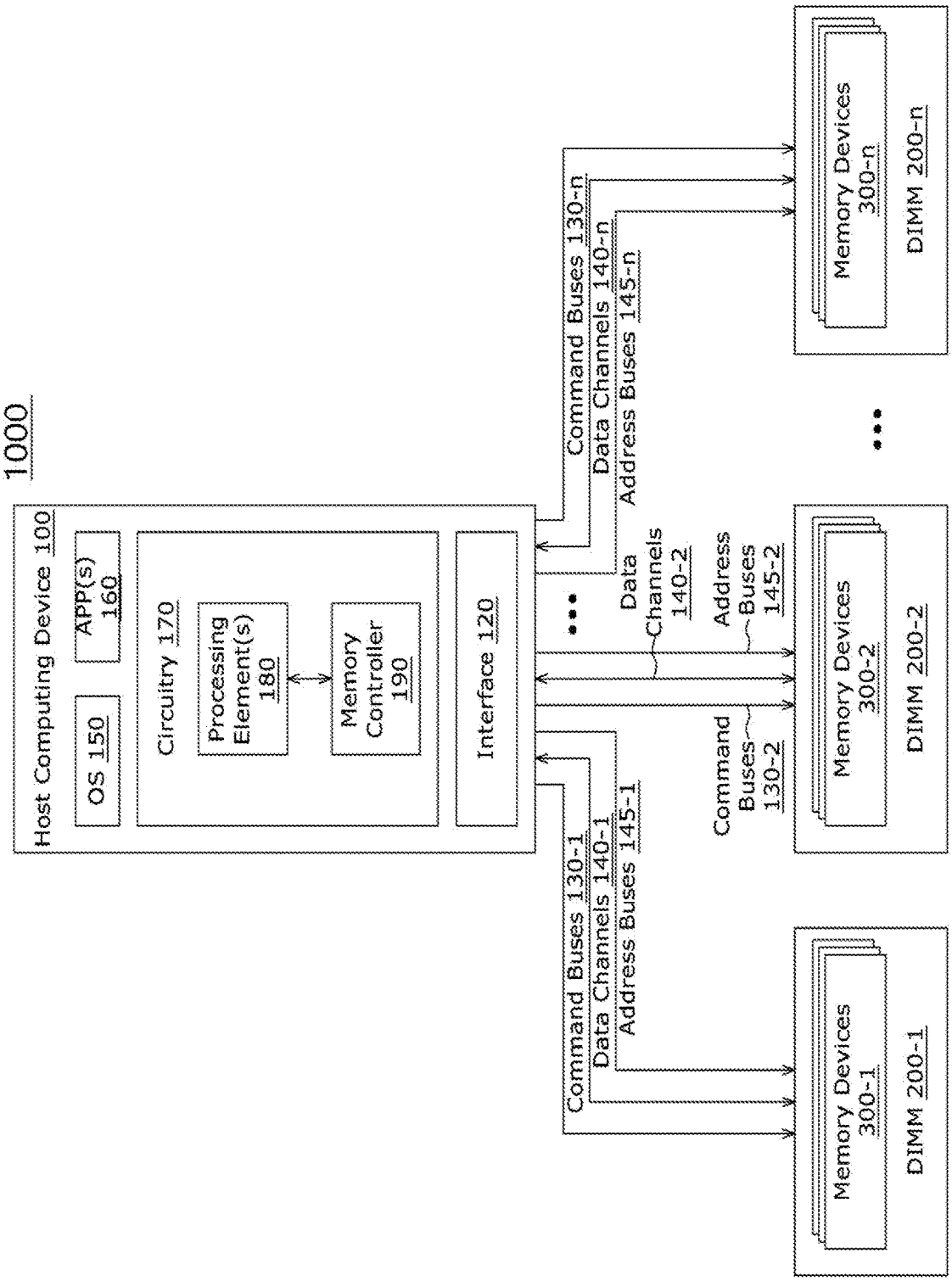
FIG. 1 is a schematic block diagram illustrating a semiconductor memory system according to an embodiment of the present disclosure.

FIG. 1 is a schematic block diagram illustrating a semiconductor memory system 1000 according to an embodiment.

Referring to FIG. 1, the semiconductor memory system 1000 may include a host computing device 100 and a plurality of dual in-line memory modules (DIMMs) 200-1 to 200-n, n being a positive integer. The plurality of DIMMs 200-1 to 200-n may be electrically coupled to the host computing device 100 via command buses 130-1 to 130-n, data channels 140-1 to 140-n, and address buses 145-1 to 145-n. For example, the DIMM 200-1 is electrically coupled to the host computing device 100 via the command bus 130-1, the data channel 140-1, and the address bus 145-1.

The host computing device 100 may include an interface 120, an operating system (OS) 150, at least one application 160, and circuity 170. The circuity 170 may include at least one processing element 180 and a memory controller 190. The processing element 180 may be a processor or a processor core, and may be electrically coupled to the memory controller 190.

The host computing device 100 may be implemented with any of a personal computer, a desktop computer, a laptop computer, a tablet, a server, a server array, a server farm, a web server, a network server, an Internet server, a workstation, a mini computer, a main frame computer, a super computer, network equipment, web equipment, a distribution system, a multiprocessor system, a processor base system, and the like.

The DIMMs 200-1 to 200-n of FIG. 1 may include a plurality of memory devices 300-1 to 300-n. FIG. 1 illustrates that a plurality of memory devices are mounted on each of the DIMMs 200-1 to 200-n. For example, a plurality of memory devices 300-1 are mounted on the DIMM 200-1.

In various embodiments, at least one volatile memory device and at least one non-volatile memory device may be integrated in each of the DIMMs 200-1 to 200-n in various forms. However, embodiments are not limited thereto.

The memory devices 300-1 to 300-n may be, for example, PCRAM modules. The PCRAM modules may include a three-dimensional (3D) cross-point array, and may have a 3D package form.

The memory controller 190 in the circuity 170 of the host computing device 100 may receive a read request READ or a write request WRITE from the application 160 or the OS 150 and provide an address, a command, data, and a control signal to the memory devices 300-1 to 300-*n* supported by the DIMMs 200-1 to 200-*n*. For example, the memory controller 190 may transfer the command, the data, and the address to the memory devices 300-1 to 300-*n* mounted on the DIMMs 200-1 to 200-*n* through the interface 120 and through the command buses 130-1 to 130-*n*, the data channels 140-1 to 140-*n*, and the address buses 145-1 to 145-*n* that are coupled to the DIMMs 200-1 to 200-*n*.

A command bus, a data channel, and an address bus coupled to the same memory device may be among the command buses 130-1 to 130-*n*, the data channels 140-1 to 140-*n*, and the address buses 145-1 to 145-*n*. The command bus, the data channel, and the address bus that are coupled to the same memory device may share at least one electrical signal line.

The memory controller 190 may input and output data to and from the memory devices 300-1 to 300-*n* in response to the read and write requests READ and WRITE. The memory controller 190 may provide various control signals to the memory devices 300-1 to 300-*n*.

The interface 120 may be configured to use a parallel or serial communication protocol related to at least one semiconductor memory technique such as double data rate 5 (DDR5), low power double data rate 5 (LPDDR5), DDR4, LPDDR4, wide I/O (WIO2), high bandwidth memory DRAM (HBM2) or HBM, serial advanced technology attachment (SATA), peripheral component Interconnect express (PCIe), universal flash storage (UFS), non-volatile DIMM (NVDIMM), or cache coherent Interconnect for accelerators (CCIX).

The DIMMs 200-1 to 200-*n* may be configured in a single type or a dual type. For example, the DIMMs 200-1 to 200-*n* may be implemented in various types such as a registered DIMM (RDIMM), a load reduced DIMM (LRDIMM), a fully buffered DIMM (FB-DIMM), an unbuffered DIMM (UDIMM), or a small outline DIMM (SODIMM).

The DIMMs 200-1 to 200-*n* may include first surfaces and second surfaces. In an example, PCRAM modules may be mounted on both the first and second surfaces of the DIMMs 200-1 to 200-*n*. In another example, PCRAM modules may be mounted on the first surfaces, and volatile memory modules or non-volatile memory modules may be mounted on the second surfaces.

Figure 2:
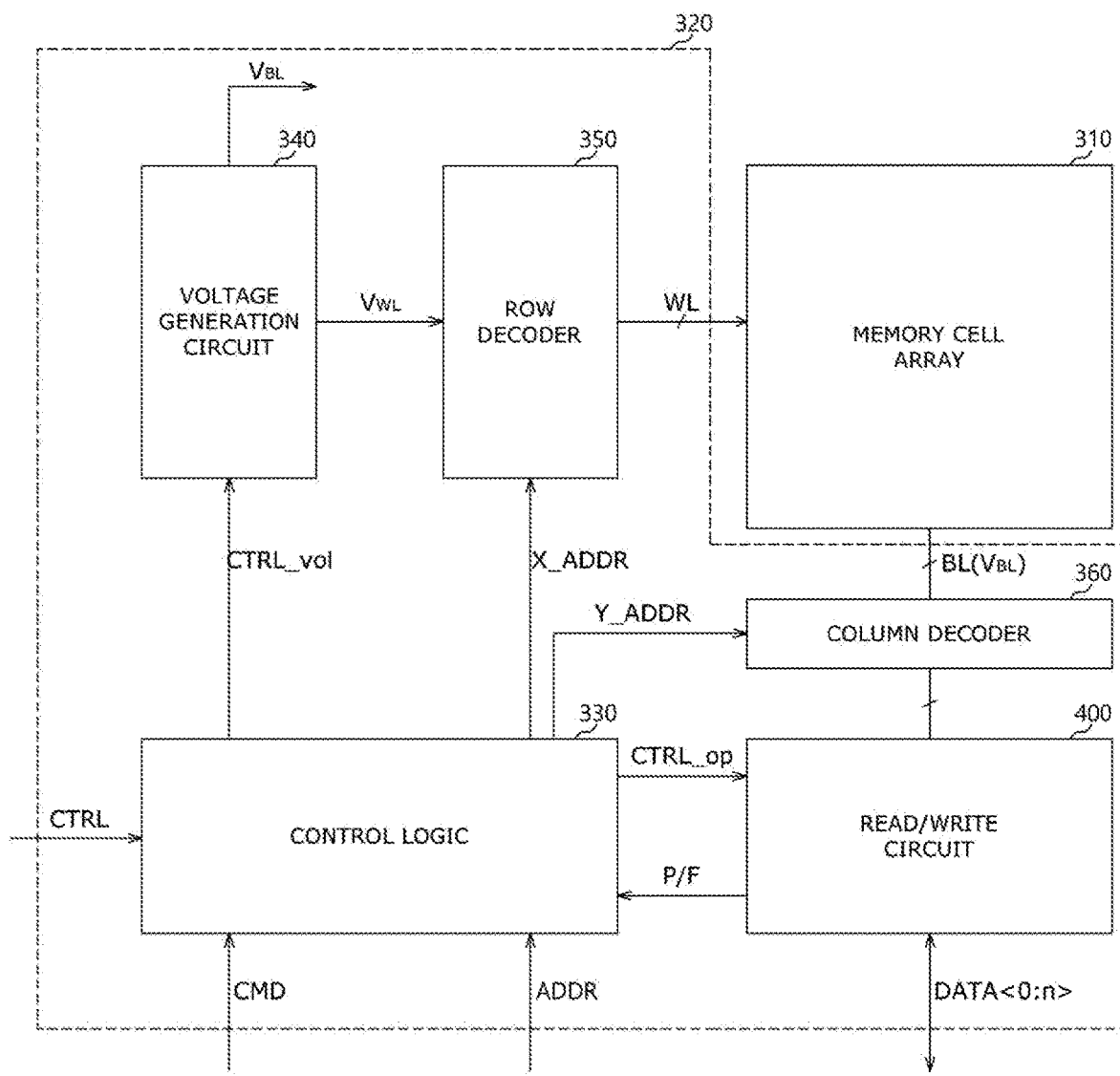
FIG. 2 is a block diagram illustrating a memory device included in the semiconductor memory system of FIG. 1 according to an embodiment of the present disclosure.

FIG. 2 is a block diagram illustrating a memory device 300 included in the semiconductor memory system of FIG. 1 according to an embodiment.

Referring to FIG. 2, the memory device 300 may include a memory cell array 310 and a control circuit block 320.

The memory cell array 310 may include a plurality of first signal lines, a plurality of second signal lines, and a plurality of memory cells. The memory cell array 310 may have a cross-point array architecture. The plurality of memory cells may be disposed in respective intersection regions between the plurality of first signal lines and the plurality of second signal lines, and may be coupled between the plurality of first signal lines and the plurality of second signal lines. For example, the first signal lines may be bit lines, and the second signal lines may be word lines. In another example, the first signal lines may be the word lines, and the second signal lines may be the bit lines.

Figure 3:
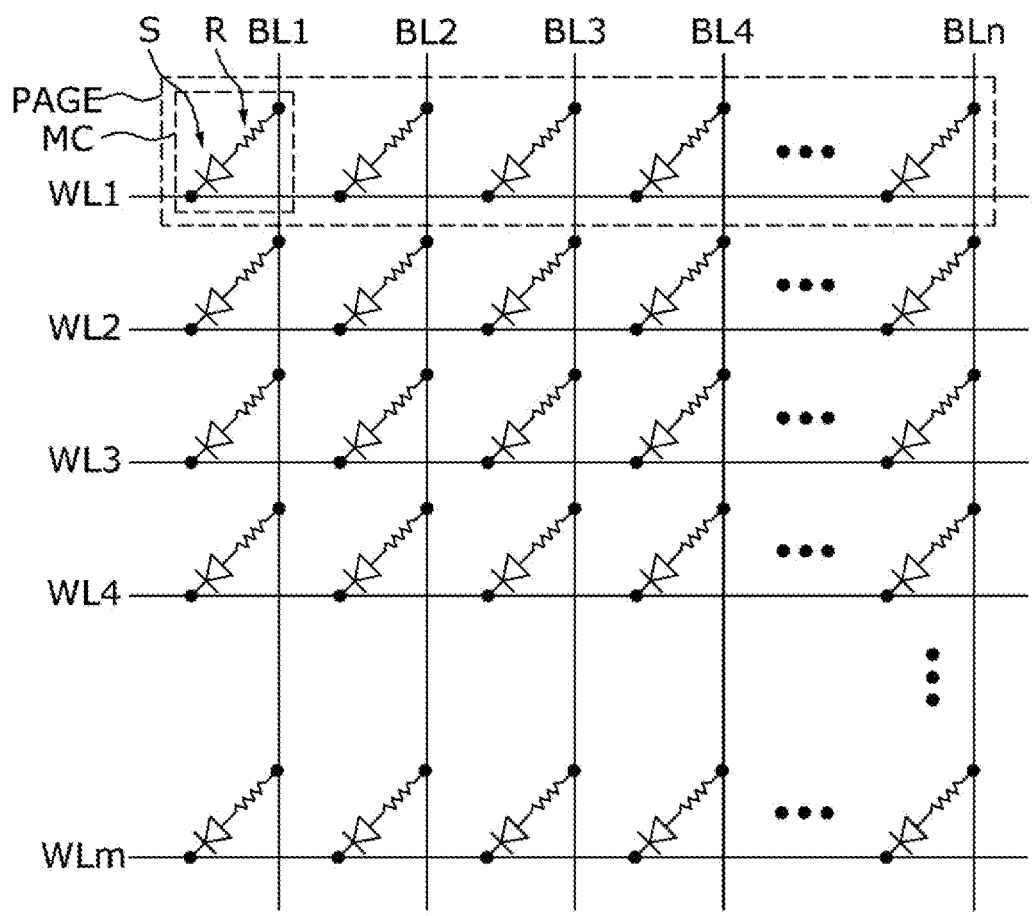
FIG. 3 is a circuit diagram illustrating a memory cell array of FIG. 2 according to an embodiment of the present disclosure.

FIG. 3 is a circuit diagram illustrating the memory cell array 310 of FIG. 2 according to an embodiment.

Referring to FIG. 3, the memory cell array 310 may include a plurality of word lines WL1 to WLm, a plurality of bit lines BL1 to BLn, and a plurality of memory cells MC, m and n being positive integers. The number of word lines, bit lines, and memory cells may be varied according to the integration degree of a memory device including the memory cell array 310. The memory cell array 310 may be implemented in a two-dimensional (2D) form or a 3D form.

Each of the memory cells MC may include a selection element S and a variable resistor R.

The selection element S may be coupled between a first end of the variable resistor R and one of the plurality of word lines WL1 to WLm. A second end of the variable resistor R may be coupled to one of the plurality of bit lines BL1 to BLn. However, in another embodiment, the selection element S may be coupled to the bit line BL, and the variable resistor R may be coupled to the word line WL.

The selection element S may control a current supply to the variable resistor R according to voltages that are applied to the word line WL and the bit line BL. In an embodiment, the selection element S may include a diode or a MOS transistor. In another embodiment, an ovonic threshold switch (OTS) including a phase-change memory layer may be used as the selection element S.

The variable resistor R may be changed to one among a plurality of resistance states in response to an electrical pulse applied to the bit line BL. The variable resistor R may include a phase-change material layer or a resistance change material layer, which has a crystalline state changing according to an amount of current applied thereto. The phase-change material layer may include a compound in which two or more elements are combined. For example, the compound may be a compound in which two elements are combined, such as any of GaSb, InSb, InSe, $Sb_2Te_3$, and GeTe; a compound in which three elements are combined, such as any of GeSbTe, GaSeTe, InSbTe, SnSb2Te$_4$, and InSbGe; a compound in which four elements are combined, such as any of AgInSbTe, (GeSn)SbTe, GeSb(SeTe), and $Te_{81}Ge_{15}Sb_2S_2$; or the like.

The phase-change material layer may have an amorphous state having a relatively high resistance and a crystalline state having a relatively low resistance. A phase of the phase-change material layer may be changed according to Joule heating, which is generated by passing a current through the phase-change material layer, and a time that the phase-change material layer is cooled. The temperature of the phase-change material may be based on an amount of current flowing through the phase-change material layer.

For example, each of the memory cells MC may be a single-level cell which stores 1 bit of data. In this example, the memory cell MC may have one of two resistance states according to the data stored therein. In another example, each of the memory cells MC may be a multi-level cell which stores 2 or more bits of data. In this example, the memory cell MC may have one of four or more resistance states according to the data stored therein.

Figure 4:
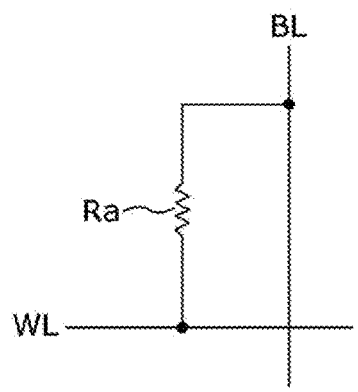
FIGS. 4 to 6 are circuit diagrams illustrating modified examples of a memory cell of FIG. 3, according to various embodiments of the present disclosure.
Figure 5:
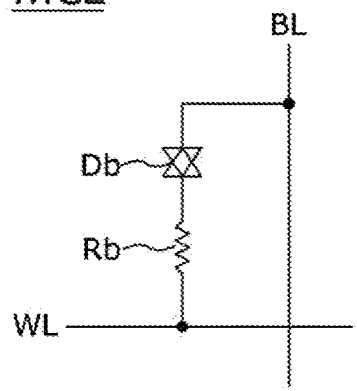
Figure 6:
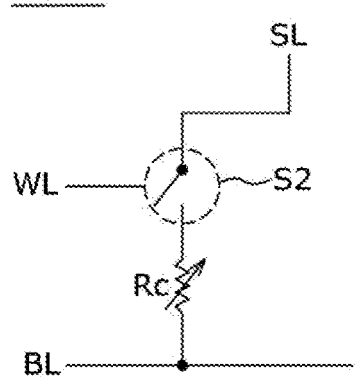

FIGS. 4 to 6 are circuit diagrams illustrating modified examples of the memory cell MC of FIG. 3.

Referring to FIG. 4, a memory cell MC1 may include a variable resistor Ra coupled between a word line WL and a bit line BL. The variable resistor Ra may selectively operate according to a voltage difference between the word line WL and the bit line BL.

Referring to FIG. 5, a memory cell MC2 may include a variable resistor Rb and a bidirectional diode Db, which are coupled in series between a bit line BL and a word line WL. The bidirectional diode Db may act as a selection element. The bidirectional diode Db may be coupled between the bit line BL and the variable resistor Rb. The variable resistor Rb may be coupled between the bidirectional diode Db and the word line WL. The bidirectional diode Db and the variable resistor Rb may be exchanged in position between the bit line BL and the word line WL. When the memory cell MC2 is not selected for a read or write operation, a leakage current flowing in the non-selected memory cell MC2 may be blocked by the bidirectional diode Db.

Referring to FIG. 6, a memory cell MC3 may include a variable resistor Rc and a 3-phase switch S2. The 3-phase switch S2 may supply or block a current to the variable resistor Rc according to a voltage of a word line WL. The 3-phase switch S2 may include a transistor or an OTS switch. When the 3-phase switch S2 is used as a selection element, a source line SL may be further included to control voltage levels at both ends of the variable resistor Rc. The 3-phase switch S2 and the variable resistor Rc may be exchanged in position.

Referring back to FIG. 3, the memory cell array 310 may include a plurality of pages PAGE. A page PAGE may include a set of memory cells that are accessible using one row address, since the page PAGE is coupled to the same signal line (for example, a word line). Each of the plurality of pages PAGE may include a set of memory cells, and the number of memory cells included in a page PAGE may be changed according to various embodiments.

Referring back to FIG. 2, the control circuit block 320 of the memory device 300 may include a control logic 330, a voltage generation circuit 340, a row decoder 350, a column decoder 360, and a read/write circuit 400.

The control logic 330 may generate various control signals for writing data DATA in the memory cell array 310 or reading data DATA from the memory cell array 310, based on a command CMD, an address ADDR, and a control signal CTRL received from the memory controller 190 of the host computing device 100 shown in FIG. 1. The various control signals may be provided to the read/write circuit 400, the voltage generation circuit 340, the row decoder 350, and the column decoder 360. Accordingly, the control logic 330 may control an overall operation of the memory device 300.

The control logic 330 may provide operation control signals CRTL_op for controlling an operation of the read/write circuit 400. For example, the operation control signals CRTL_op may include a write enable signal, a read enable signal, a sensing enable signal, a discharge enable signal, a precharge enable signal, and the like. The control logic 330 may generate a voltage control signal CTRL_vol and provide the generated voltage control signal CTRL_vol to the voltage generation circuit 340. The control logic 330 may provide a row address X_ADDR to the row decoder 350 and provide a column address Y_ADDR to the column decoder 360.

The voltage generation circuit 340 may generate various types of voltages for performing a write operation, a read operation, and an erase operation based on the voltage control signals CTRL_vol, and may provide the generated voltages to the memory cell array 310. For example, the voltage generation circuit 340 may generate a word line driving voltage $V_{WL}$ for driving a plurality of word lines WL and generate a bit line driving voltage $V_{BL}$ for driving a plurality of bit lines BL. The word line driving voltage $V_{WL}$ and/or the bit line driving voltage $V_{BL}$ may include a reset write voltage, a set write voltage, an inhibit voltage, a read voltage, a verify voltage, and the like.

The row decoder 350 may be configured to activate a word line selected from among the plurality of word lines WL in response to the row address X_ADDR received from the control logic 330.

The column decoder 360 may be configured to activate a bit line selected from among the plurality of bit lines BL in response to the column address Y_ADDR received from the control logic 330.

Figure 7:
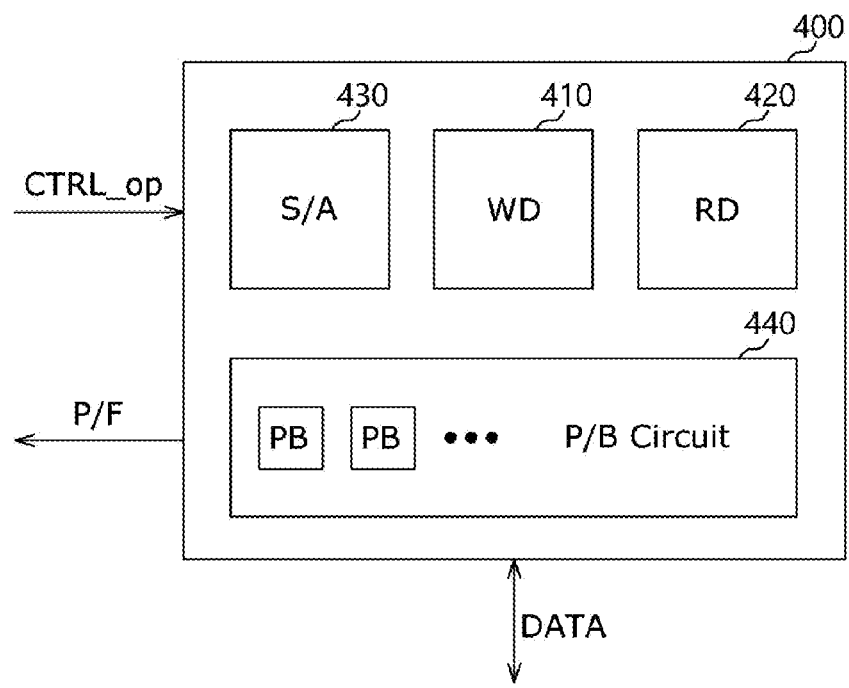
FIG. 7 is a block diagram illustrating a read/write circuit according to an embodiment of the present disclosure.

FIG. 7 is a block diagram illustrating the read/write circuit 400 of FIG. 2 according to an embodiment.

The read/write circuit 400 may be configured to perform a data read operation and a data write operation of the memory device 300. The read/write circuit 400 may include a write driver (WD) 410, a read driver (RD) 420, a sense amplifier (S/A) 430, and a page buffer circuit (PB) 440.

The write driver 410 may be coupled to the plurality of bit lines BL and may provide a write pulse to a selected bit line in response to a write command from the memory controller 190 illustrated in FIG. 1. Accordingly, data DATA provided from the memory controller 190 may be stored in a selected memory cell MC, which is coupled to the selected bit line. Here, the write pulse may be a current pulse or a voltage pulse.

In a write operation, a resistance value of a variable resistor R of the selected memory cell MC in the memory cell array 310 may be determined according to a logic level of the data DATA. In an embodiment, when the variable resistor R includes a phase-change material layer, the variable resistor R may have a set state and a reset state.

The read driver 420 may be coupled to the plurality of bit lines BL and provide a read pulse for reading data DATA stored in the selected memory cell MC coupled to the selected bit line. The read driver 420 may be configured to output the data DATA stored in the selected memory cell MC to the memory controller 190 when a read command is input from the memory controller 190. For example, the read pulse may have a voltage level (or a current level) that does not change a resistance state of the phase-change material layer.

The sense amplifier 430 may be configured to sense the resistance value of the selected memory cell MC. The sense amplifier 430 may be electrically coupled to a sensing node of the selected bit line and sense the resistance value of the selected memory cell MC by comparing a voltage on the sensing node and a reference voltage.

The page buffer circuit 440 may be coupled to the memory cell array 310 through the plurality of bit lines BL. For example, the page buffer circuit 440 may receive input data DATA from the memory controller 190 and provide the input data DATA to the memory cell array 310. In another example, the page buffer circuit 440 may read out data DATA from the memory cell array 310 and transfer the read data DATA to the memory controller 190. In a read operation, the page buffer circuit 440 may temporarily store a sensing result. In an embodiment, the page buffer circuit 440 may perform a function of the sense amplifier 430, and thus the sense amplifier 430 may be omitted. The page buffer circuit 440 may include a plurality of page buffers PB corresponding to the plurality of bit lines BL, respectively.

The read/write circuit 400 having the above-described configuration illustrated in FIG. 7 may receive the various operation control signals CTRL_op from the control logic 330 illustrated in FIG. 2 and transfer a pass/fail signal P/F determined by a read result of the read data DATA to the control logic 330.

Figure 8:
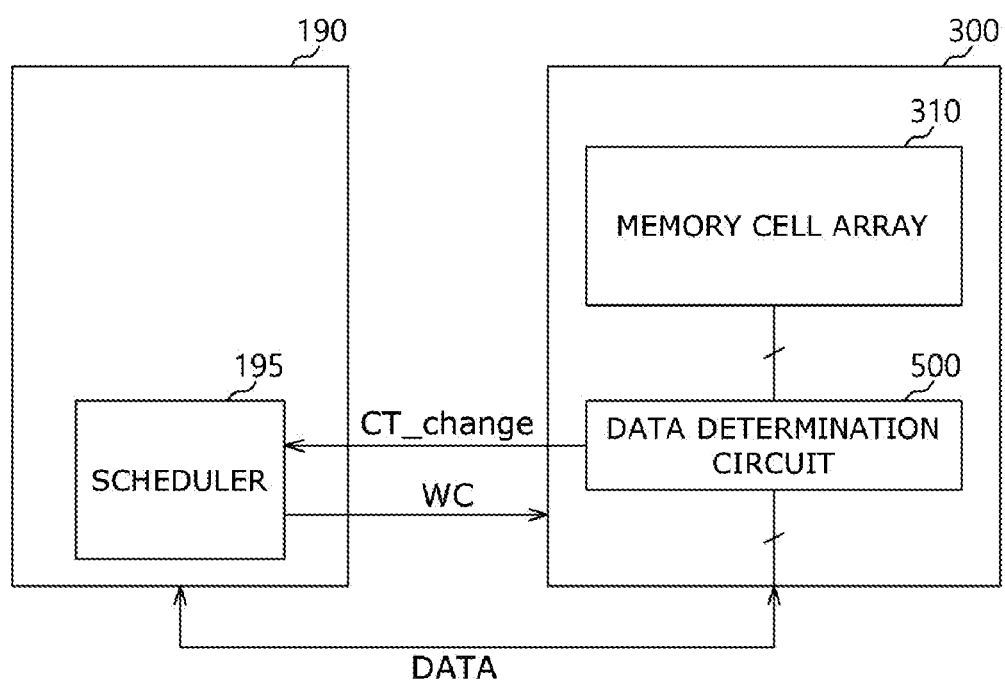
FIG. 8 is a block diagram illustrating a memory controller and a memory device in a semiconductor memory system according to an embodiment of the present disclosure.

FIG. 8 is a block diagram illustrating a memory controller 190 and a memory device 300 in a semiconductor memory system according to an embodiment.

Referring to FIG. 8, the memory device 300 may include a data determination circuit 500 that is configured to generate a change signal CT_change according to levels of data DATA input from the memory controller 190. The memory controller 190 may include a scheduler 195 that is configured to control a command generation period.

The data determination circuit 500 may generate the change signal CT_change when the levels of the input data DATA are equal to each other and transfer the change signal CT_change to the scheduler 195. The scheduler 195 may change a generation period of a write command WC in response to the change signal CT_change and provide the write command WC, which is generated with the changed generation period, to the memory device 300.

Figure 9:
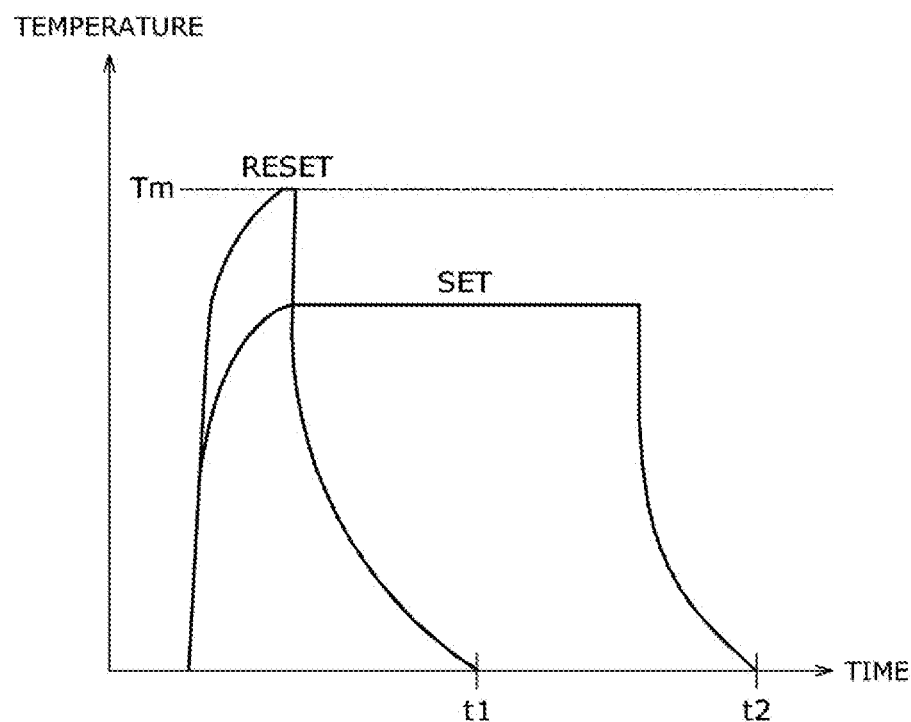
FIG. 9 is a graph illustrating a set pulse and a reset pulse of a phase-change material layer.

FIG. 9 is a graph illustrating a set pulse and a reset pulse of a phase-change material layer.

As is well-known, a phase-change material layer included in a memory cell of a PCRAM may have a set state or a reset state according to a logic level of data DATA stored in the memory cell. For example, when the data DATA is "0 (low)," the phase-change material layer may have a crystalline state when it is in the "set state." As illustrated in FIG. 9, the crystalline state of the phase-change material layer may be obtained by melting the phase-change material layer with a relatively low-temperature and slowly cooling down the melted phase-change material layer.

When the data DATA is "1 (high)," the phase-change material layer may have an amorphous state when it is in the "reset state." The amorphous state of the phase-change material layer may be obtained by melting the phase-change material layer with a relatively high-temperature and rapidly quenching the melted phase-change material layer as illustrated in FIG. 9. In FIG. 9, the reference numeral Tm refers to a melting temperature of the phase-change material layer.

In a conventional PCRAM, a phase-change operation is performed by controlling only Joule heating, and the cooling time is set to a long crystallization time t2 corresponding to the set state.

However, in an embodiment, when all data to be stored in a plurality of bit lines BL have, for example, a reset state, the cooling time may be changed to a short crystallization time, e.g., t1 shown in FIG. 9, for forming the reset state. Accordingly, a generation period of a write command, for example, a write recovery time tWR, may be reduced by reducing the cooling time, i.e., the crystallization time, and thus the phase-change time of the PCRAM may be reduced. As a result, a write operation time of the PCRAM may be reduced.

Referring back to FIG. 8, the data determination circuit 500 may include a reset determination circuit that is configured to generate a change signal CT_change_R. The reset determination circuit may be coupled to various parts of the memory device 300.

Figure 10:
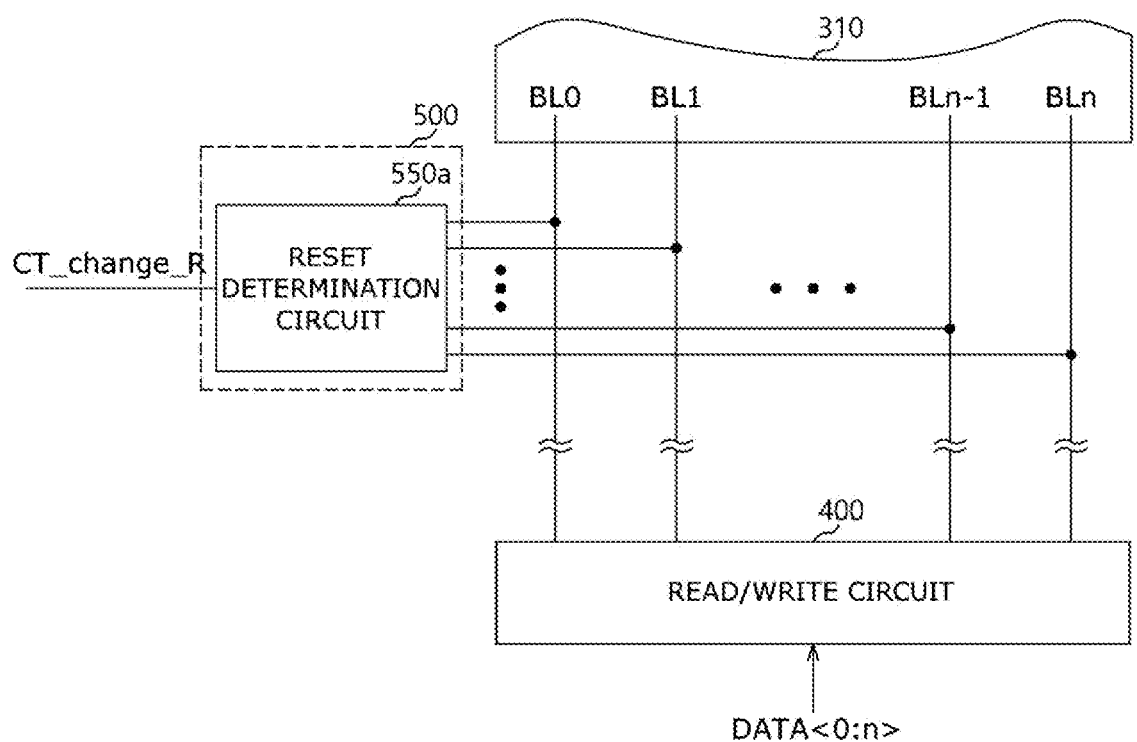
FIGS. 10 to 12 are schematic block diagrams, each of which illustrates a coupling position of a reset determination circuit, according to various embodiments of the present disclosure.
Figure 11:
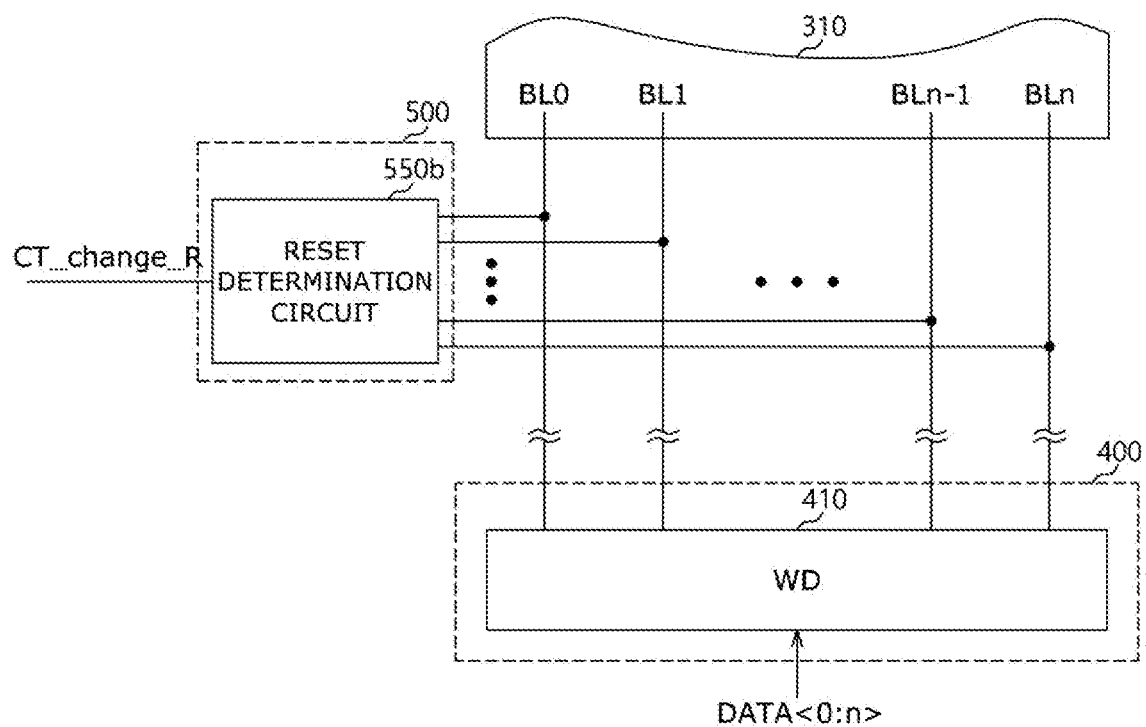
Figure 12:
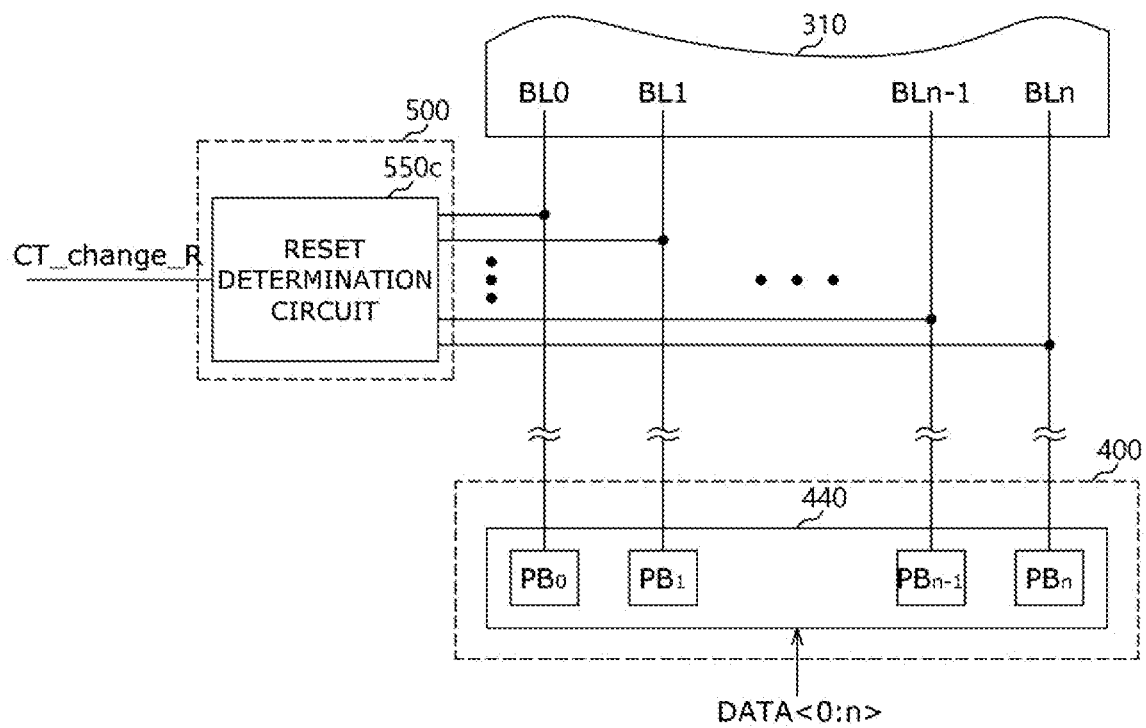

FIGS. 10 to 12 are schematic block diagrams illustrating reset determination circuits 550a, 550b, and 550c, each of which is included in the data determination circuit 500 of FIG. 8, according to embodiments.

The reset determination circuit 550a of FIG. 10 may be coupled between a read/write circuit 400 and the memory cell array 310 in the memory device 300 shown in FIG. 8. The reset determination circuit 550a may receive data DATA<0:n> provided to bit lines BL<0:n> from the read/write circuit 400 and may generate the change signal CT_change_R according to levels of the data DATA<0:n>.

The reset determination circuit 550b of FIG. 11 may be coupled between a write driver (WD) 410, which is within a read/write circuit 400, and the memory cell array 310. The reset determination circuit 550b may receive data DATA<0:n> provided to bit lines BL<0:n> from the write driver 410 and may generate the change signal CT_change_R according to levels of the data DATA<0:n>.

As illustrated in FIG. 12, the reset determination circuit 550c may be coupled between page buffers PB0 to PBn in a page buffer circuit 440, which is within a read/write circuit 400, and the memory cell array 310. The reset determination circuit 550c may receive data DATA<0:n> provided to bit lines BL<0:n> from the page buffers PB0 to PBn, and may generate the change signal CT_change_R according to levels of the data DATA<0:n>.

Figure 13:
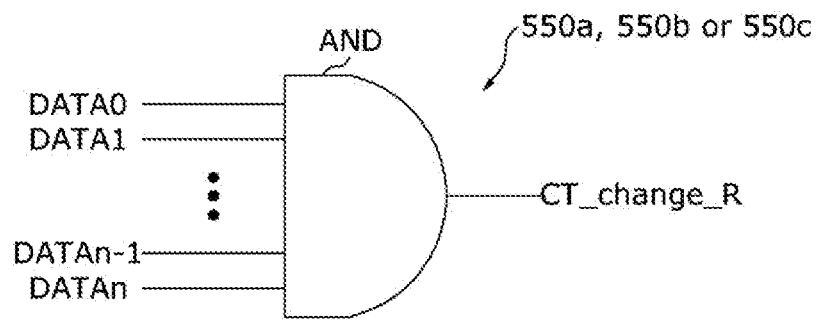
FIG. 13 is a circuit diagram illustrating a reset determination circuit according to an embodiment of the present disclosure.

FIG. 13 is a circuit diagram illustrating a reset determination circuit according to an embodiment.

As illustrated in FIG. 13, each of the reset determination circuits 550a, 550b, and 550c illustrated in FIGS. 10 to 12 may include a combination of logic gates that are collectively similar to an AND gate. For example, each of the reset determination circuits 550a, 550b, and 550c may output the change signal CT_change_R enabled to a high level when all levels of the input data DATA<0:n> have a high level (for example, the reset state). It is illustrated in FIG. 13 that each of the reset determination circuits 550a, 550b, and 550c is a logic gate which performs a logic AND operation. However, embodiments are not limited thereto, and each of the reset determination circuits 550a, 550b, and 550c may include any combination of circuit elements that are configured to perform the logic AND operation.

Figure 14:
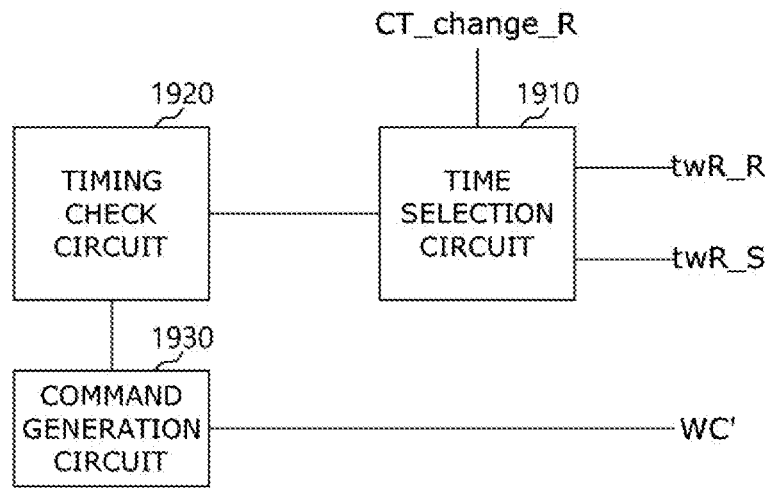
FIG. 14 is a block diagram illustrating a scheduler in a memory controller according to an embodiment of the present disclosure.
Figure 15A:
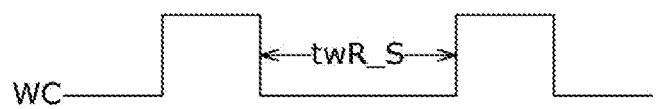
FIGS. 15A and 15B are a timing diagram illustrating a write recovery time according to an embodiment of the present disclosure.
Figure 15B:
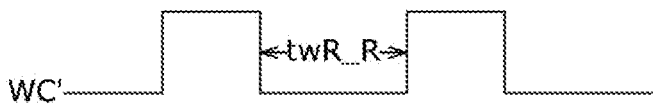

FIG. 14 is a block diagram illustrating a scheduler in a memory controller according to an embodiment. FIGS. 15A and 15B are a timing diagram illustrating a write recovery time according to an embodiment.

Referring to FIG. 14, a scheduler 195 may include a time selection circuit 1910, a timing check circuit 1920, and a command generation circuit 1930.

The time selection circuit 1910 may receive a reset write recovery time tWR_R and a set write recovery time tWR_S. The time selection circuit 1910 may select, as a write recovery time tWR, one of the reset write recovery time tWR_R and the set write recovery time tWR_S in response to a change signal CT_change_R, which is, e.g., output from the data determination circuit 500 shown in FIG. 8.

Here, as illustrated in FIGS. 15A and 15B, the write recovery time tWR may be a time taken until a next write command is generated from the generation of a current write command. That is, the write recovery time tWR determines an interval between two consecutive write commands. In general, when at least one of a plurality of pieces of data has a low level corresponding to a set state, the scheduler 195 may set, as a default, the set write recovery time tWR_S by considering a crystallization time of the set state as illustrated in FIGS. 15A and 15B. That is, the write recovery time tWR may be set to the set recovery time tWR_S, regardless of whether a write state is a set state or a reset state. In an embodiment, the reset write recovery time tWR_R may be additionally defined based on a crystallization time of a reset state, as illustrated in FIGS. 15A and 15B.

In an embodiment, the time selection circuit 1910 may include a two-input multiplexer. The time selection circuit 1910 may be configured to select the reset write recovery time tWR_R when the change signal CT_change_R is enabled to a high level.

The timing check circuit 1920 may determine the generation timing of the write command based on the write recovery time tWR_S or tWR_R output from the time selection circuit 1910. The timing check circuit 1920 may include a counter circuit (not shown), and may control an interval between two consecutive write commands by driving the counter circuit differently using either the write recovery time tWR_S or the write recovery time tWR_R, which is output from the time selection circuit 1910.

The command generation circuit 1930 may be configured to generate a write command WC or WC' shown in FIGS. 15A and 15B in response to a timing control signal provided from the timing check circuit 1920.

In an embodiment, when the set write recovery time tWR_S is selected by the change signal CT_change_R, the command generation circuit 1930 may generate the write command WC with an interval corresponding to the set write recovery time tWR_S. On the other hand, when the reset write recovery time tWR_R is selected by the change signal CT_change_R, the command generation circuit 1930 may generate the write command WC' with an interval corresponding to the reset write recovery time tWR_R.

Figure 16:
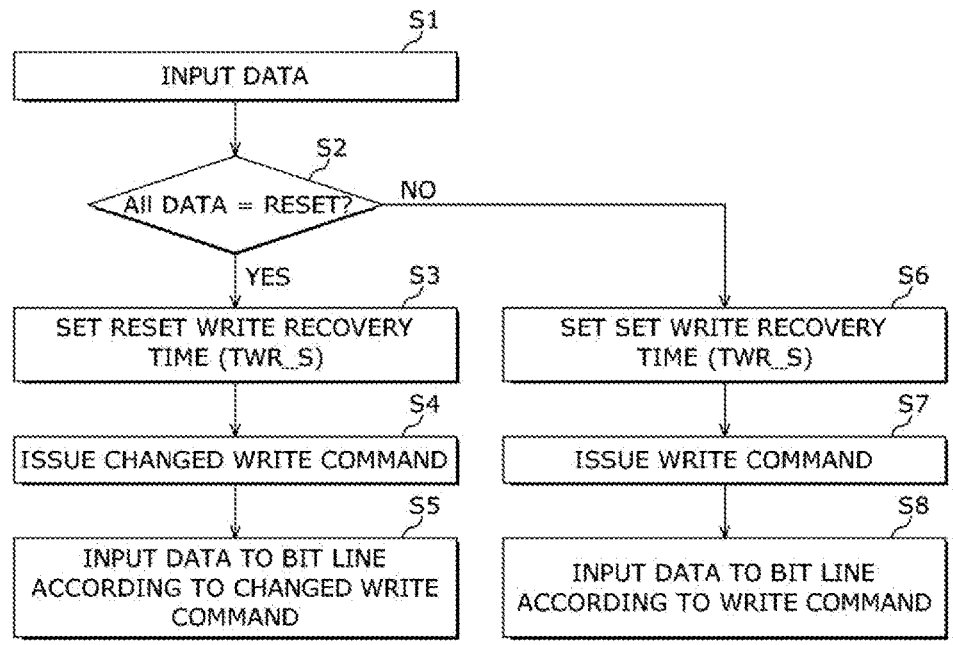
FIG. 16 is a flowchart illustrating an operation of a semiconductor memory system according to an embodiment of the present disclosure.

FIG. 16 is a flowchart illustrating an operation of a semiconductor memory system according to an embodiment. The operation of FIG. 16 will be described with reference to FIGS. 8 and 10 to 12.

Referring to FIG. 16, data DATA<0:n> may be input to the memory device 300 (S1).

In an embodiment, before the data DATA<0:n> are transferred to the bit lines BL<0:n>, the data DATA<0:n> may be input to the reset determination circuit 550a, 550b, or 550c. The reset determination circuit 550a, 550b, or 550c may determine whether or not each of the input data DATA<0:n> has a reset state, for example, whether each of the input data DATA<0:n> has a high level (S2).

When each of the input data DATA<0:n> has the high level, the reset determination circuit 550a, 550b, or 550c may enable the change signal CT_change_R, and may provide the enabled change signal CT_change_R to the scheduler 195 of the memory controller 190.

The scheduler 195 may set the reset write recovery time tWR_R as a write recovery time tWR in response to the enabled change signal CT_change_R (S3). The scheduler 195 may generate a write command WC' having a generation period that corresponds to the reset write recovery time tWR_R (S4). Since the reset write recovery time tWR_R is shorter than the set write recovery time tWR_S, the write command WC' may have the write command generation period, which is shorter than a generation period of a write command WC, the write command WC corresponding to the set write recovery time tWR_S.

In an embodiment, after the write command WC' is generated, the data DATA<0:n> may be input to the bit lines BL<0:n> according to the write command WC' (S5).

When the data DATA<0:n> have different logic levels from each other or each of the data DATA<0:n> has a low level corresponding to the set state, the reset determination circuit 550a, 550b or 550c may disable the change signal CT_change_R. Accordingly, the scheduler 195 of the memory controller 190 may set or maintain the set write recovery time tWR_S as the write recovery time tWR (S6). The scheduler 195 may generate a write command WC having a generation period that corresponds to the set write recovery time tWR_S (S7).

The data DATA<0:n> may be input to the bit lines BL<0:n> according to the write command WC (S8).

According to the embodiments, when each of the input data DATA<0:n> to be stored in the memory cell array 310 has the reset state, a write operation for the input data DATA<0:n> may be performed according to the changed write command WC', which is generated based on a shorter write recovery time corresponding to the reset write recovery time tWR_R. Thus the total write operation time of the memory device 300 may be reduced.

Figure 17:
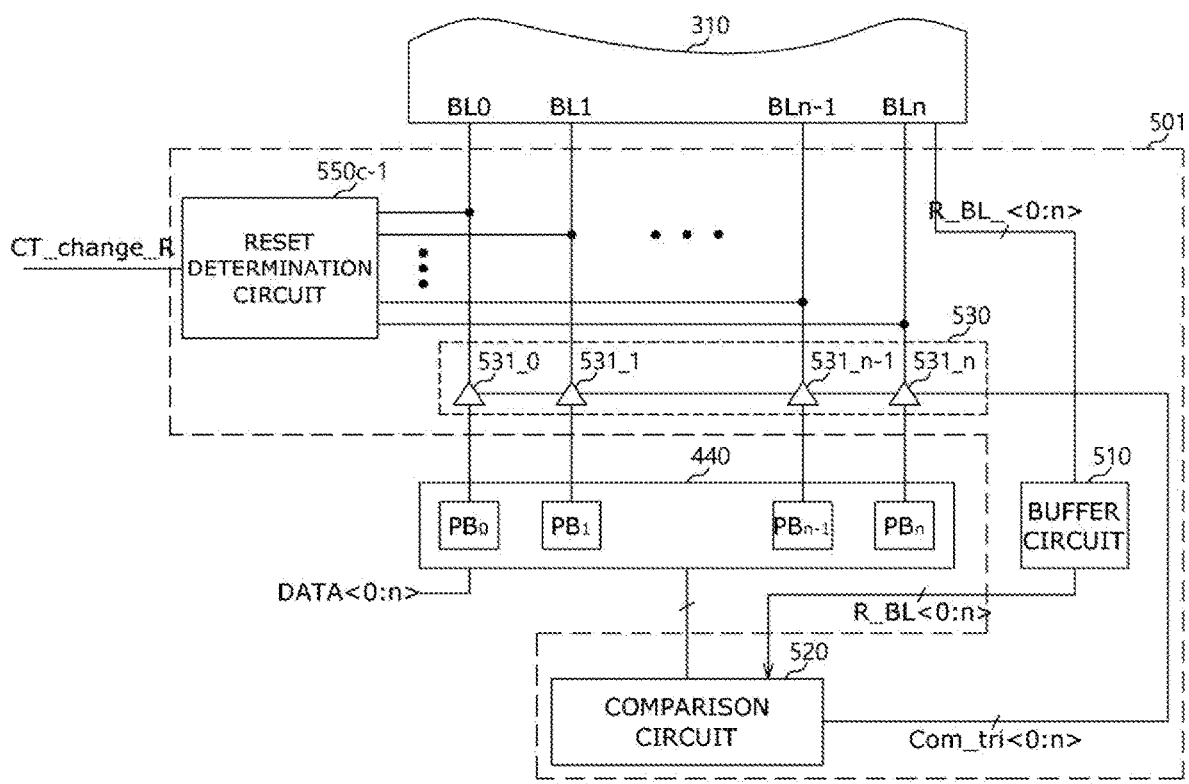
FIG. 17 is a block diagram illustrating a data determination circuit according to an embodiment of the present disclosure.

FIG. 17 is a block diagram illustrating a data determination circuit 501 of a memory device according to another embodiment.

Referring to FIG. 17, the data determination circuit 501 may include a buffer circuit 510, a comparison circuit 520, a selective blocking circuit 530, and a reset determination circuit 550c-1.

The buffer circuit 510 may temporarily store bit line signals R_BL<0:n> read from the bit lines BL<0:n>. The buffer circuit 510 may include a SRAM or a register.

The comparison circuit 520 may generate comparison signals Com_tri<0:n> by comparing data DATA<0:n> and the bit line signals R_BL<0:n> stored in the buffer circuit 510. In FIG. 17, the data DATA<0:n> are transferred to the comparison circuit 520 via a page buffer circuit 440, but embodiments are not limited thereto. In another embodiment, the data DATA<0:n> may be directly input to the comparison circuit 520 from the memory controller 190 illustrated in FIG. 1, or may be input to the comparison circuit 520 via another circuit in the memory device.

The comparison circuit 520 may generate the comparison signals Com_tri<0:n> according to whether or not the bit line signals R_BL<0:n> are identical with the data DATA<0:n>. The bit line signals R_BL<0:n> correspond to data input to the bit lines BL<0:n> according to a previous write command WC. The data DATA<0:n> are provided from the memory controller 190 at this time.

For example, the comparison circuit 520 may generate the enabled comparison signals Com_tri<0:n> when the bit line signals R_BL<0:n> stored in the buffer circuit 510 are identical with the data DATA<0:n> input from the memory controller 190.

The selective blocking circuit 530 may selectively transfer the data DATA<0:n> to the bit lines BL<0:n> of the memory cell array 310 in response to the comparison signals Com_tri<0:n>. The selective blocking circuit 530 may include a plurality of tri-state gates 531-0 to 531-n that are coupled to the plurality of page buffers PB0 to PBn, respectively.

Each of the plurality of tri-state gates 530-1 to 531_n may be a three-phase buffer circuit. The plurality of tri-state gates 530-1 to 531_n may block the transfer of the data DATA<0:n> to the bit lines BL<0:n> when the comparison signals Com_tri<0:n> are enabled.

The plurality of tri-state gates 530-1 to 530-n may transfer the newly input data DATA<0:n> to the corresponding bit lines BL<0:n> when the corresponding comparison signals Com_tri<0:n> are disabled.

For example, the selective blocking circuit 530 may skip an input operation of the data DATA<0:n> when the bit line signals R_BL<0:n> are identical with the newly input data DATA<0:n>. As a result, it is possible to prevent a write operation, which repeatedly writes the same data into the bit lines BL<0:n>, from being performed.

The reset determination circuit 550c-1 may receive the data DATA<0:n> that have passed the selective blocking circuit 530 and generate the enabled change signal CT_change_R when each of the data DATA<0:n> has a high level corresponding to the reset state.

Figure 18:
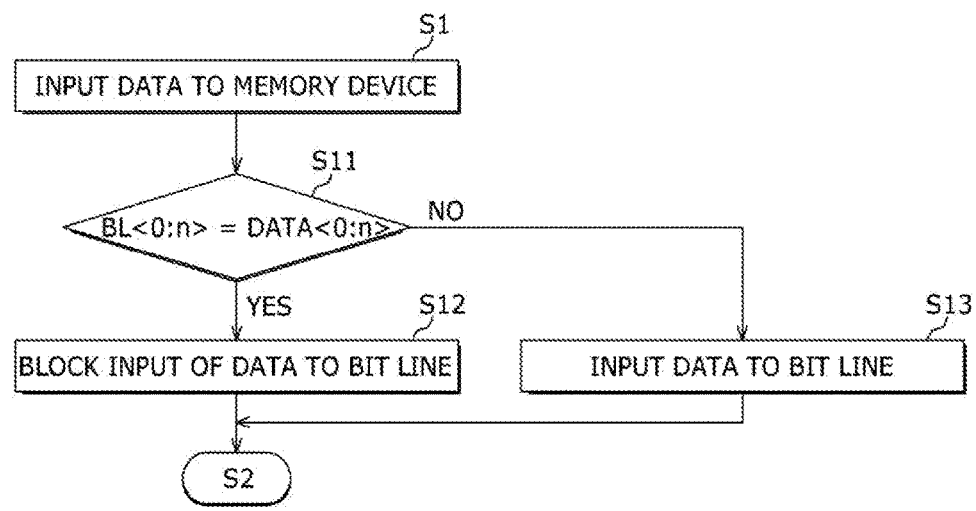
FIG. 18 is a flowchart illustrating an operation of the data determination circuit of FIG. 17.

FIG. 18 is a flowchart illustrating an operation of the data determination circuit 550c-1 of FIG. 17 according to an embodiment. The operation of FIG. 18 may be performed between step S1 and step S2, which are described with reference to FIG. 16.

Referring to FIGS. 17 and 18, the memory device 300 may receive the input data DATA<0:n> from the memory controller 190 (S1).

The comparison circuit 520 may compare the bit line signals R_BL<0:n> stored in the buffer circuit 510 and the input data DATA<0:n> (S11).

When the bit line signals R_BL<0:n> are identical with the input data DATA<0:n>, the comparison signals Com_tri<0:n> may be enabled, and thus the selective blocking circuit 530 may be driven to block the transfer of the input data DATA<0:n> to the corresponding bit lines BL<0:n> (S12).

On the other hand, when the bit line signals R_BL<0:n> are different from the data DATA<0:n>, the comparison signals Com_tri<0:n> may be disabled, and thus the selective blocking clock 530 may be driven to transfer the input data DATA<0:n> to the bit lines BL<0:n> (S13).

After that, the memory device 300 may proceed to step S2 of FIG. 16, so that the subsequent operations shown in FIG. 16 are performed.

That is, as shown in FIG. 16, it is determined at step S2 whether each of the input data DATA<0:n> transferred through the selective blocking circuit 530 has a high level corresponding to the reset state. Then, the subsequent steps S3 to S8 are selectively performed depending on the determination result.

Figure 19:
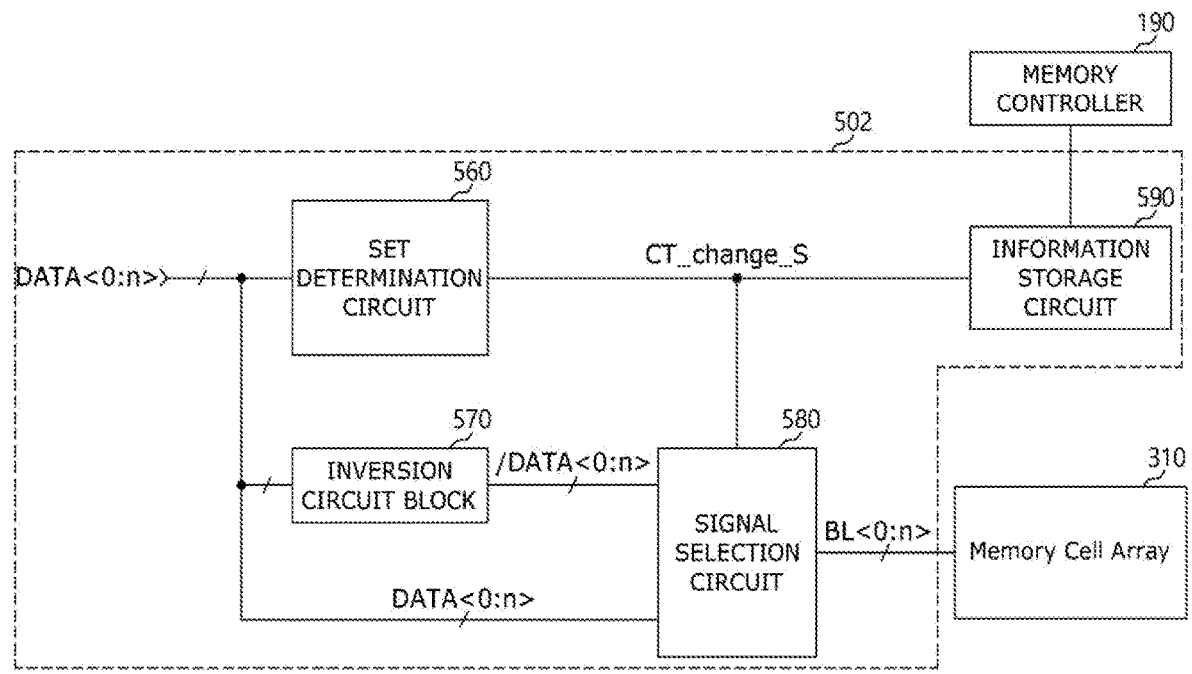
FIG. 19 is a block diagram illustrating a data determination circuit according to another embodiment of the present disclosure.
Figure 20:
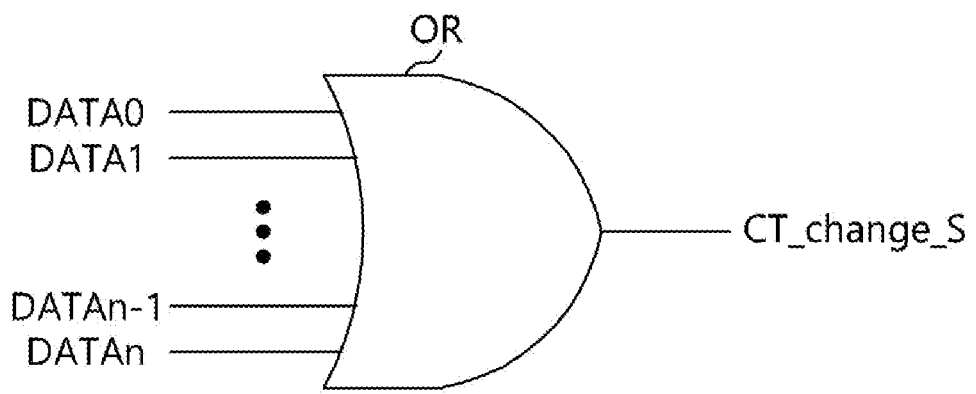
FIG. 20 is a circuit diagram illustrating a set determination circuit according to an embodiment of the present disclosure.

FIG. 19 is a block diagram illustrating a data determination circuit according to another embodiment. FIG. 20 is a circuit diagram illustrating a set determination circuit of FIG. 19 according to an embodiment.

Referring to FIG. 19, a data determination circuit 502 may include a set determination circuit 560, an inversion circuit block 570, a signal selection circuit 580, and an information storage circuit 590.

The set determination circuit 560 may receive input data DATA<0:n> and generate a change signal CT_change_S that is enabled to a low level (or a high level) when each of the input data DATA<0:n> has a low level (for example, a set state). In an embodiment, an input terminal of the set determination circuit 560 may be coupled to the read/write circuit 400 and may receive the input data DATA<0:n> from the read/write circuit 400, but embodiments are not limited thereto. In another embodiment, the set determination circuit 560 may directly receive the input data DATA<0:n> from the memory controller 190.

As illustrated in FIG. 20, the set determination circuit 560 may include a combination of logic gates that are collectively configured to perform a logic OR operation on the input data DATA<0:n>. However, embodiments are not limited thereto. In another embodiment, the set determination circuit 560 may include any circuit configuration that performs a logic OR operation, or any circuit configuration that performs a logic NOR operation.

Referring back to FIG. 19, the inversion circuit block 570 may be configured to invert the input data DATA<0:n> and output the inverted input data /DATA<0:n>. The inversion circuit block 570 may include a plurality of inverters (not shown) that are configured to invert the input data DATA<0:n>.

The signal selection circuit 580 may be configured to select one of the inverted input data /DATA<0:n> and the input data DATA<0:n> in response to the change signal CT_change_S. For example, the signal selection circuit 580 may include a multiplexer circuit. The data selected by the signal selection circuit 580 may be input to the bit lines BL<0:n>.

When the enabled change signal CT_change_S is output from the set determination circuit 560, the information storage circuit 590 may store information indicating that the inverted input data /DATA<0:n> are input to the bit lines BL<0:n>. The information storage circuit 590 may be provided in a separate cache memory device (not shown) such as a DRAM, or in a storage of the memory device 300 that is a register, but embodiments are not limited thereto.

Figure 21:
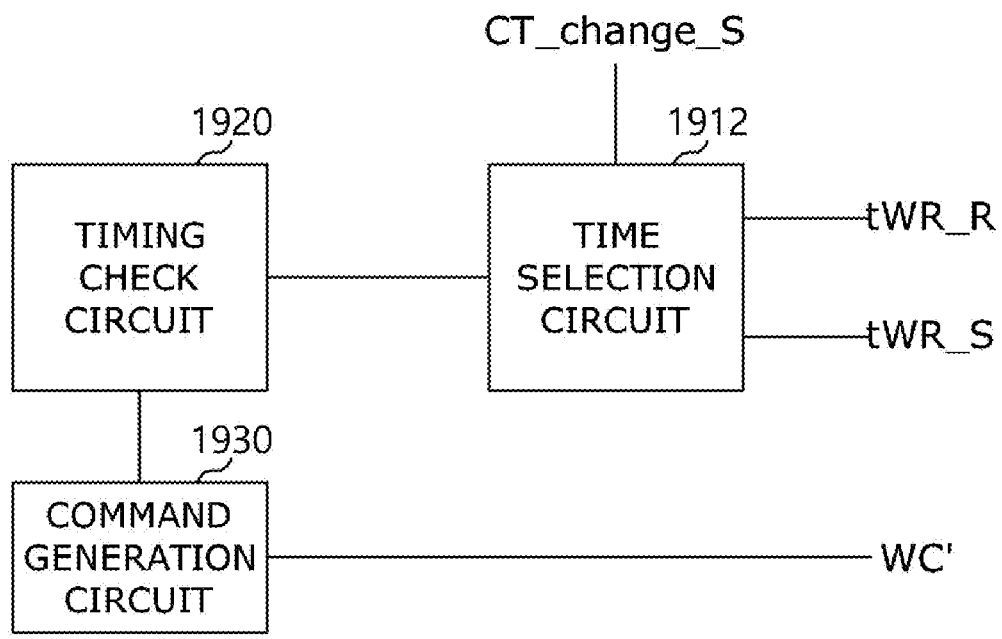
FIG. 21 is a block diagram illustrating a scheduler of a memory controller according to another embodiment of the present disclosure.

FIG. 21 is a block diagram illustrating a scheduler 195a of a memory controller according to another embodiment.

Referring to FIG. 21, the scheduler 195a may include a time selection circuit 1912, a timing check circuit 1920, and a command generation circuit 1930.

The time selection circuit 1912 may receive the reset write recovery time tWR_R and the set write recovery time tWR_S, and may select one of the reset write recovery time tWR_R and the set write recovery time tWR_S in response to the change signal CT_change_S, which is generated by, e.g., the set determination circuit 560 in FIG. 19. In an embodiment, the time selection circuit 1912 may select the reset write recovery time tWR_R when the enabled change signal CT_change_S is input.

In an embodiment, even when each of the input data DATA<0:n> has a low level and thus the enabled change signal CT_change_S is generated, the relatively short reset write recovery time tWR_R may be set as a generation period of a write command using a data flip operation.

The timing check circuit 1920 may determine a generation timing of a write command based on the recovery time tWR_S or tWR_R output from the time selection circuit 1912. When the enabled change signal CT_change_S is input, the command generation circuit 1930 may generate a write command WC' in response to a timing control signal, i.e., the reset write recovery time tWR_R, which is provided from the timing check circuit 1920.

Figure 22:
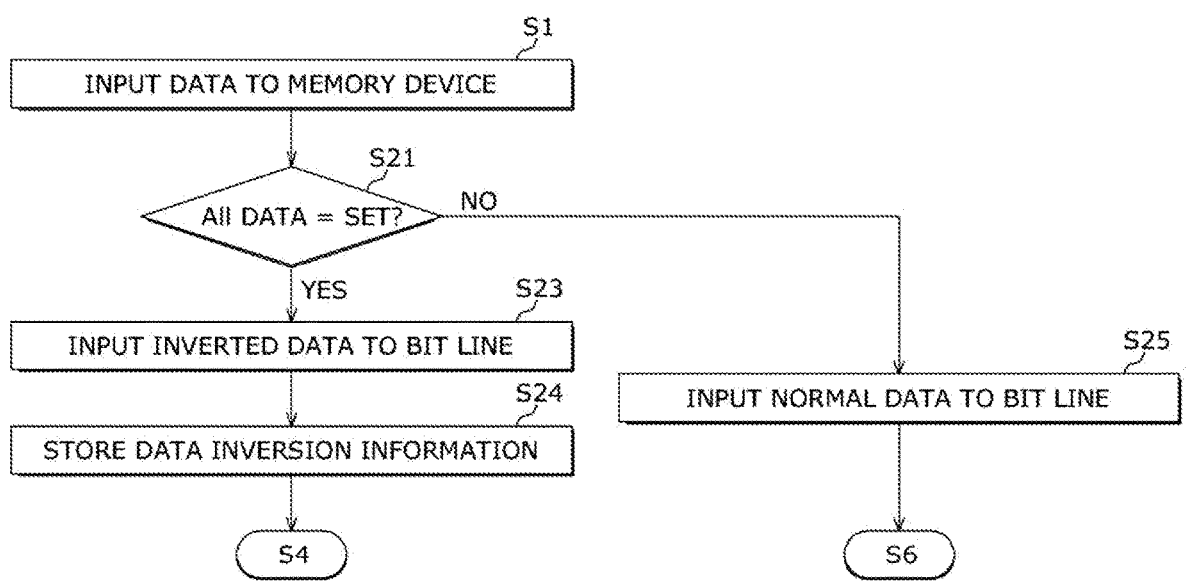
FIG. 22 is a flowchart illustrating an operation of the data determination circuit of FIG. 19.

FIG. 22 is a flowchart illustrating an operation of the data determination circuit 502 of FIG. 19 according to an embodiment.

Referring to FIGS. 19 and 22, data DATA<0:n> may be input to the memory device 300 (S1).

The set determination circuit 560 may determine whether or not each of the input data DATA<0:n> has the set state (for example, a low level) (S21). When each of the input data DATA<0:n> has the set state, the set determination circuit 560 may output the enabled change signal CT_change_S.

The inverted input data /DATA<0:n>, which is generated by the inversion circuit block 570, and the input data DATA<0:n> may be input to the signal selection circuit 580. The signal selection circuit 580 may transfer the inverted input data /DATA<0:n> to the bit lines BL<0:n> of the memory cell array 310 in response to the enabled change signal CT_change_S (S23). The information storage circuit 590 may store data inversion information indicating that the inverted input data /DATA<0:n> are input to the bit lines BL<0:n> of the memory cell array 310 (S24).

The enabled change signal CT_change_S may be input to a scheduler in the memory controller 190, e.g., the scheduler 195a shown in FIG. 21. The scheduler 195a may set the reset write recovery time tWR_R as the write recovery time tWR in response to the enabled change signal CT_change_S (see step S3 of FIG. 16) and then the memory device 300 may perform subsequent operations, for example, steps S4 and S5, which are described with reference to FIG. 16.

For example, when each of the input data DATA<0:n> has the set state (i.e., a low level), the data determination circuit 502 may input the inverted input data /DATA<0:n> having a high level corresponding to the reset state to the bit lines BL<0:n> of the memory cell array 310, and store the information indicating that the inverted input data /DATA<0:n> are input to the bit lines BL<0:n> in the information storage circuit 590. Then, since, in a read operation, the data determination circuit 502 may provide data corresponding to the input data DATA<0:n> to the memory controller 190 using the information stored in the information storage circuit 590, data read errors may be prevented.

As described above, even if the input data DATA<0:n> each having the set state are input, the data determination circuit 502 may invert the input data DATA<0:n> and input the inverted input data /DATA<0:n> to the bit lines BL<0:n>. Accordingly, even if each of the input data DATA<0:n> has the set state, a write recovery time corresponding to a crystallization time for the reset state may be selected in order to generate a write command, and thus a write time of the memory device 300 may be reduced.

On the other hand, when at least one of the data DATA<0:n> does not have the set state, the data determination circuit 502 may input the input data DATA<0:n> to the bit lines BL<0:n> (S25). In some embodiments, when at least one of the data DATA<0:n> does not have the set state and thus the change signal CT_change_S is disabled, the memory controller 190 may set the set write recovery time tWR_S as a write recovery time (S6 of FIG. 16), and may generate a write command WC corresponding to the set write recovery time tWR_S (S7 of FIG. 16). The input data DATA<0:n> are input to the bit lines BL<0:n> (S8 of FIG. 16).

Figure 23:
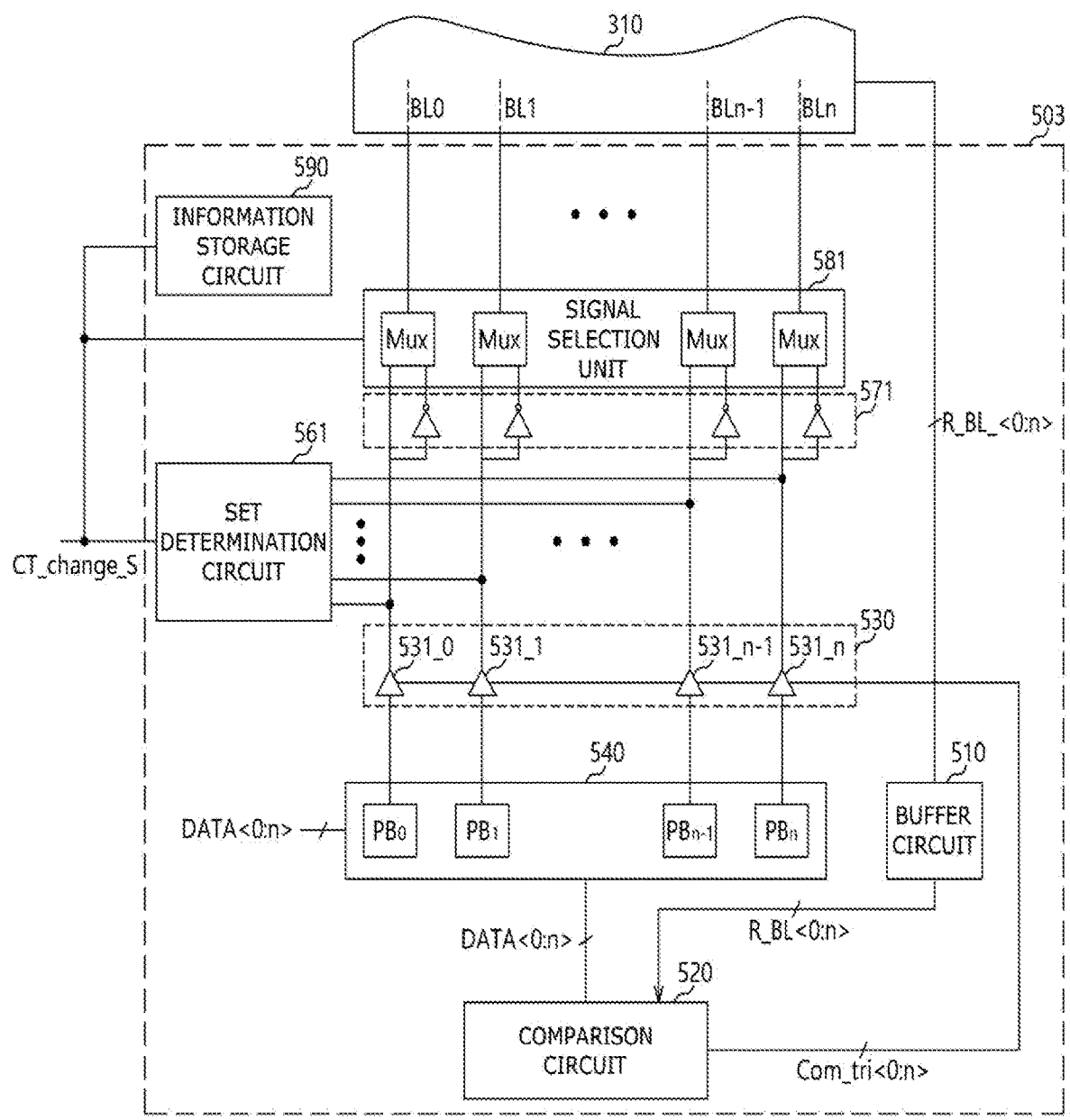
FIG. 23 is a block diagram illustrating a data determination circuit according to still another embodiment of the present disclosure.

FIG. 23 is a block diagram illustrating a data determination circuit according to another embodiment.

Referring to FIG. 23, a data determination circuit 503 may include a buffer circuit 510, a comparison circuit 520, a selective blocking circuit 530, an inversion circuit block 571, a signal selection circuit 581, a set determination circuit 561, and an information storage circuit 590.

As described above with reference to FIG. 17, the buffer circuit 510 may temporarily store bit line signals R_BL<0:n>, which are read from the bit lines BL<0:n>.

The comparison circuit 520 may generate comparison signals Com_tri<0:n> by comparing newly input data DATA<0:n> and the bit line signals R_BL<0:n> stored in the buffer circuit 510. In an embodiment, the input data DATA<0:n> are transferred to the comparison circuit 520 via a page buffer circuit 540, but embodiments are not limited thereto. In other embodiments, the input data DATA<0:n> may be directly input to the comparison circuit 520 from the memory controller 190, or may be input to the comparison circuit 520 via other circuits. The comparison circuit 520 may generate the enabled comparison signals Com_tri<0:n> when the bit line signals R_BL<0:n> stored in the buffer circuit 510 are identical with the data DATA<0:n> that is newly input from the memory controller 190.

The selective blocking circuit 530 may include a plurality of tri-state gates 531-0 to 531-n, and may selectively block the transfer of the input data DATA<0:n> to the bit line BL<0:n> of the memory cell array 310 in response to the comparison signals Com_tri<0:n>.

When the corresponding comparison signals Com_tri<0:n> are not enabled, the plurality of tri-state gates 531-0 to 531-n may transfer the input data DATA<0:n> to the corresponding bit lines BL<0:n>.

The inversion circuit block 571 may generate inverted input data /DATA<0:n> by inverting the input data DATA<0:n> transferred by the selective blocking circuit 530. The inversion circuit block 571 may include a plurality of inverters.

The signal selection circuit 581 may be configured to receive the input data DATA<0:n> provided from the selective blocking circuit 530 and the inverted input data /DATA<0:n> provided from the inversion circuit block 571, and output the input data DATA<0:n> or the inverted input data /DATA<0:n> in response to a control signal, for example, the change signal CT_change_S output from the set determination circuit 561. The signal selection circuit 581 may include a plurality of multiplexers MUX.

The set determination circuit 561 may receive the input data DATA<0:n> output from the selective blocking circuit 530 and generate the enabled change signal CT_change_S when each of the input data DATA<0:n> has the set state, i.e., a low level.

The information storage circuit 590 may store information indicating that the inverted input data /DATA<0:n> are input to the bit lines BL<0:n> of the memory cell array 310 in response to the enabled change signal CT_change_S. The information stored in the information storage circuit 590 may be used as a control signal for restoring data output in a read operation.

Figure 24:
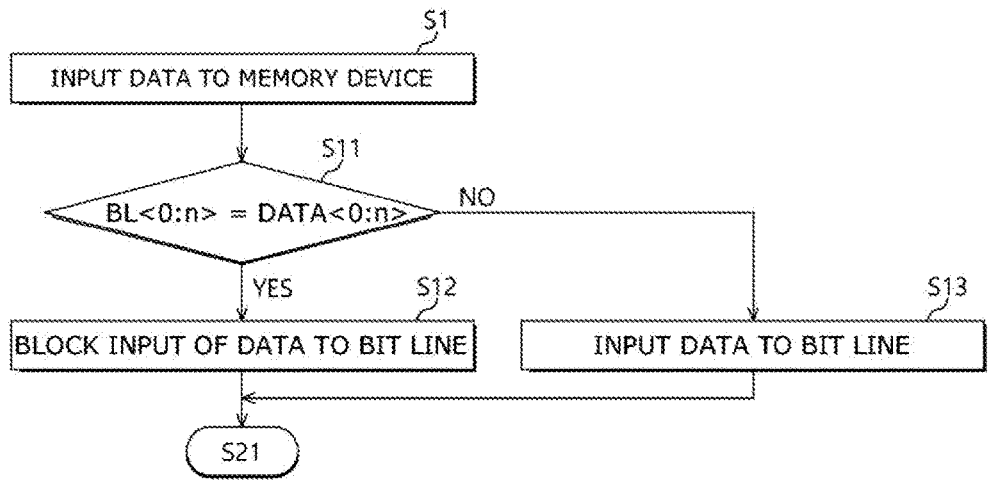
FIG. 24 is a flowchart illustrating an operation of the data determination circuit of FIG. 23.

FIG. 24 is a flowchart illustrating an operation of the data determination circuit 503 of FIG. 23 according to an embodiment.

Referring to FIGS. 23 and 24, the memory device 300 may receive the input data DATA from the memory controller 190 (S1).

The comparison circuit 520 may compare the bit line signal R_BL<0:n>, which is input/output in a previous write and/or read operation and is stored in the buffer circuit 510, with newly input data DATA<0:n> (S11).

When the bit line signal R_BL<0:n> are identical with the input data DATA<0:n>, the transfer of the input data DATA<0:n> to the corresponding bit lines BL<0:n> may be blocked by the selective blocking circuit 530 (S12).

On the other hand, when the bit line signals R_BL<0:n> are not identical with the input data DATA<0:n>, the selective blocking circuit 530 may transfer the input data DATA<0:n> to the bit lines BL<0:n> of the memory cell array 310 (S13).

The set determination circuit 561 may enable the change signal CT_change_S according to levels of the input data DATA<0:n> transferred through the selective blocking circuit 530 when each of the input data DATA<0:n> has a low level (S21). The data determination circuit 503 may perform steps S23 and S24 of FIG. 22.

Figure 25:
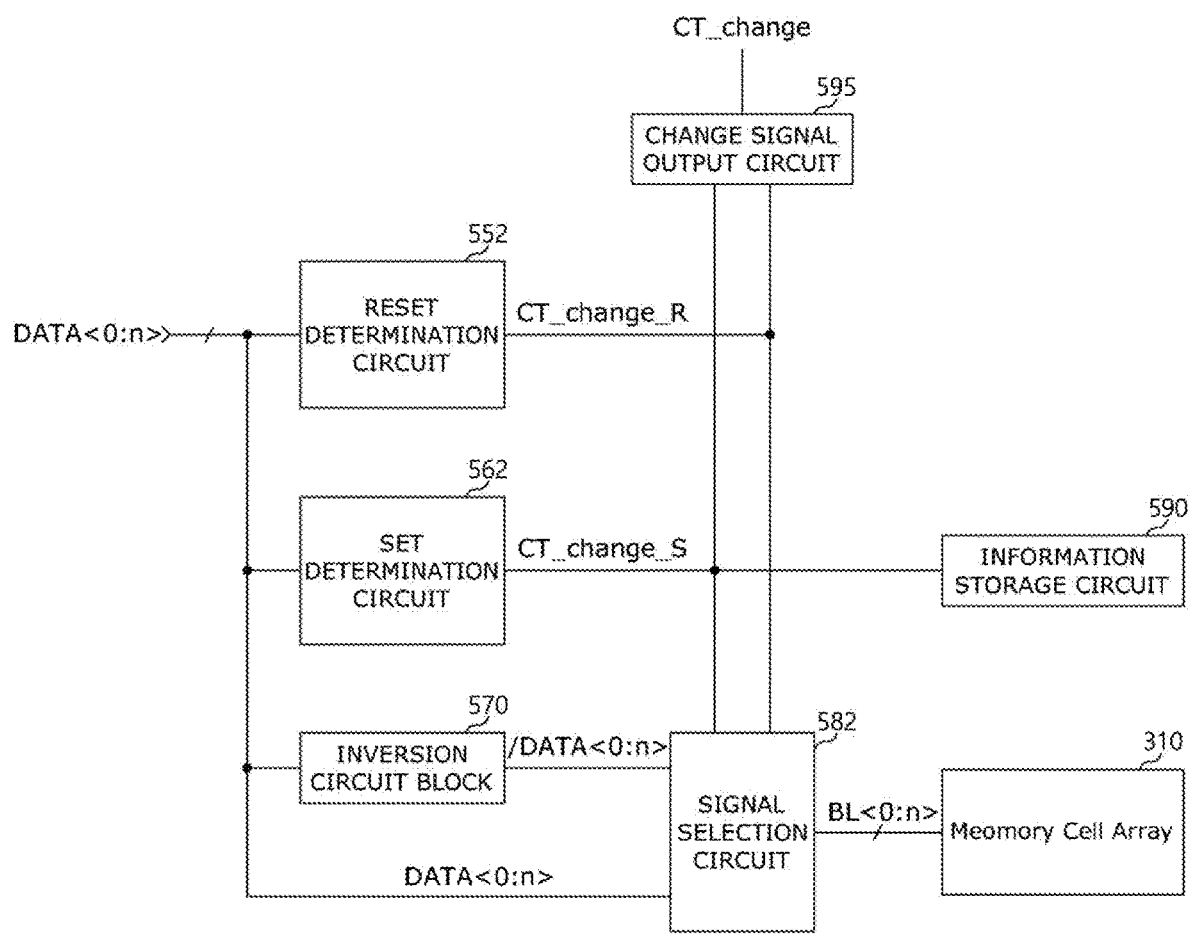
FIG. 25 is a block diagram illustrating a data determination circuit according to still another embodiment of the present disclosure.

FIG. 25 is a block diagram illustrating a data determination circuit according to another embodiment.

Referring to FIG. 25, a data determination circuit 504 may include a reset determination circuit 552, a set determination circuit 562, an inversion circuit block 570, a signal selection circuit 582, an information storage circuit 590, and a change signal output circuit 595.

The reset determination circuit 552 may receive data DATA<0:n> input from the memory controller 190. The reset determination circuit 552 may generate a first change signal CT_change_R, which is enabled when each of the input data DATA<0:n> has a high level (for example, the reset state). The reset determination circuit 552 may include, for example, a circuit configured to perform a logic AND operation.

The set determination circuit 562 may also receive the data DATA<0:n> input from the memory controller 190. The set determination circuit 562 may generate a second change signal CT_change_S enabled when each of the input data DATA<0:n> has a low level (for example, the set state). The set determination circuit 562 may include, for example, a circuit configured to perform a logic OR operation.

The inversion circuit block 570 may invert the data DATA<0:n> and output inverted data /DATA<0:n>. The data DATA<0:n> input to the reset determination circuit 552, the set determination circuit 562, and the inversion circuit block 570 may be data directly input from the memory controller 190, but embodiments are not limited thereto. In another embodiment, the data DATA<0:n> may be input to the reset determination circuit 552, the set determination circuit 562, and the inversion circuit block 570 via an arbitrary circuit block that is configured to receive and process the data DATA<0:n>, such as the read/write circuit 400 of the memory device 300.

The signal selection circuit 582 may receive the data DATA<0:n> and the inverted data /DATA<0:n>, and may provide a data group selected from the data DATA<0:n> and the inverted data /DATA<0:n> to the bit lines BL<0:n> of the memory cell array 310. The signal selection circuit 582 may receive the first change signal CT_change_R and the second change signal CT_change_S as control signals. For example, when the first change signal CT_change_R is enabled, the signal selection circuit 582 may output the data DATA<0:n> to the bit lines BL<0:n>. On the other hand, when the second change signal CT_change_S is enabled, the signal selection circuit 582 may output the inverted data /DATA<0:1> to the bit lines BL<0:n>.

When the second change signal CT_change_S is enabled, the information storage circuit 590 may store information indicating that the inverted data /DATA<0:n> are transferred to the bit lines BL<0:n> of the memory cell array 310. Then, in a read operation, the data determination circuit 504 may invert read data output from the memory cell array 310 based on the information stored in the information storage circuit 590, and provide the inverted read data to the memory controller 190. The information storage circuit 590 may be included in a separate cache memory device or in a storage device of a semiconductor memory device such as a register, but embodiments are not limited thereto.

Figure 26:
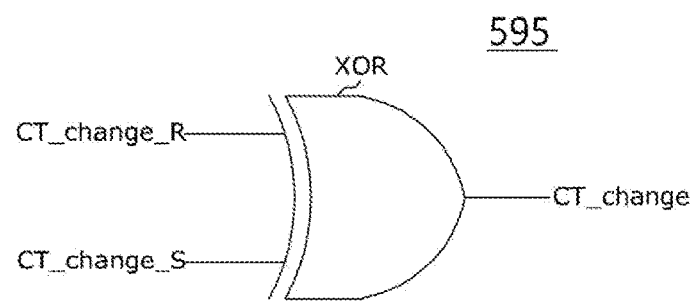
FIG. 26 is a circuit diagram illustrating a change signal output circuit of FIG. 25 according to an embodiment of the present disclosure.

The change signal output circuit 595 may receive the first change signal CT_change_R and the second change signal CT_change_S, and may output a final change signal CT_change when any one of the first change signal CT_change and the second change signal CT_change_S is enabled. For example, as illustrated in FIG. 26, the change signal output circuit 595 may include any circuit configured to perform a logic operation similar to an exclusive-OR (XOR) operation.

Figure 27:
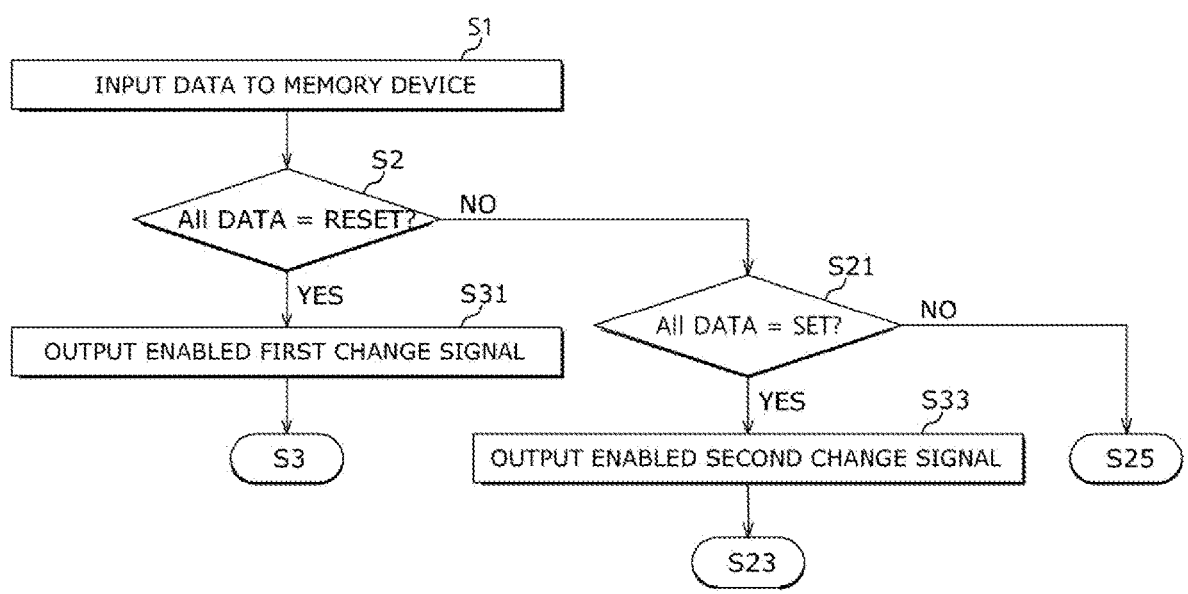
FIGS. 27 and 28 are flowcharts illustrating driving methods of the data determination circuit of FIG. 25 according to embodiments of the present disclosure.

FIG. 27 is a flowchart illustrating a driving method of the data determination circuit 504 of FIG. 25 according to an embodiment.

Referring to FIGS. 25 and 27, the data DATA<0:n> may be input to the memory device 300 from the memory controller 190 (S1).

The data DATA<0:n> input to the memory device 300 may be input to the reset determination circuit 552, and the reset determination circuit 552 may determine whether or not all the data DATA<0:n> have a high level corresponding to the reset state (S2).

When each of the data DATA<0:n> has the high level, the reset determination circuit 552 may output the enabled first change signal CT_change_R to the signal selection circuit 582 and to the change signal output circuit 595 (S31). The change signal output circuit 595 may output the final change signal CT_change in response to the enabled first change signal CT_change_R. The memory device 300 may perform an operation of setting the reset write recovery time tWR_R as the write recovery time tWR in response to the final change signal CT_change (e.g., S3 of FIG. 16) and may perform the subsequent operations, e.g., steps S4 and S5 shown in FIG. 16.

On the other hand, when at least one of the data DATA<0:n> does not have the high level, the set determination circuit 562 may determine whether or not each of the input data DATA<0:n> has a low level corresponding to the set state (S21).

When each of the data DATA<0:n> has the low level, the set determination circuit 552 may output the enabled second change signal CT_change_S to the signal selection circuit 482, the information storage circuit 590, and the change signal output circuit 595 (S33). As the second change signal CT_change_S is enabled, the change signal output circuit 595 may output the final change signal CT_change for setting the reset write recovery time tWR_R as the write recovery time tWR (S33). In an embodiment, the data determination circuit 504 may sequentially perform steps S23 and S24 of FIG. 22 while the reset write recovery time tWR_R is set as the write recovery time tWR. In another embodiment, the data determination circuit 504 may sequentially perform steps S23 and S24 of FIG. 22 after the reset write recovery time tWR_R is set as the write recovery time tWR.

When the input data DATA<0:n> have both the low level and the high level, the data determination circuit 504 may sequentially perform step S25 of FIG. 22 and the subsequent steps, e.g., steps S6 to S8 of FIG. 16.

At this time, in an embodiment, omitting an input for a portion of the data DATA<0:n> may be added between step S1 and step S2 when the previously input data R_BL<0:n> are identical with the newly input data DATA<0:n>, as illustrated in FIG. 18.

Figure 28:
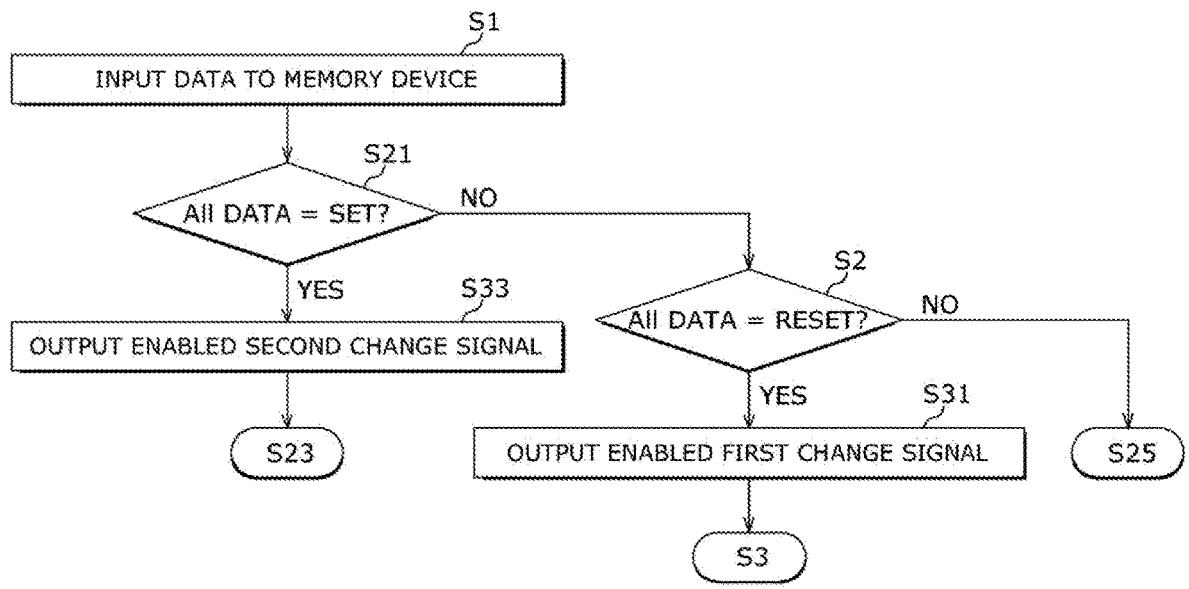

In an embodiment, the reset determination circuit 552 may operates before the set determination circuit 562 operates. However, as illustrated in FIG. 28, the operation (S21) of the set determination circuit 562 may be performed before the operation (S2) of the reset determination circuit 552. At this time, the embodiment of omitting input for a portion of the data DATA<0:n> may be applied between step S1 and step S21 when the previously input data R_BL<0:n> are identical with the newly provided data DATA<0:n>, as illustrated in FIG. 18.

Figure 29:
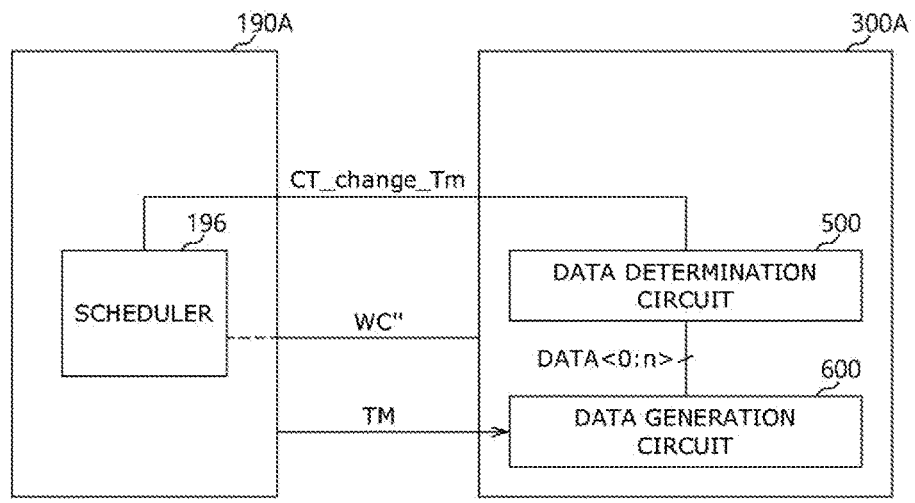
FIG. 29 is a block diagram illustrating a memory controller and a memory device in a semiconductor memory system according to another embodiment of the present disclosure.
Figure 30:
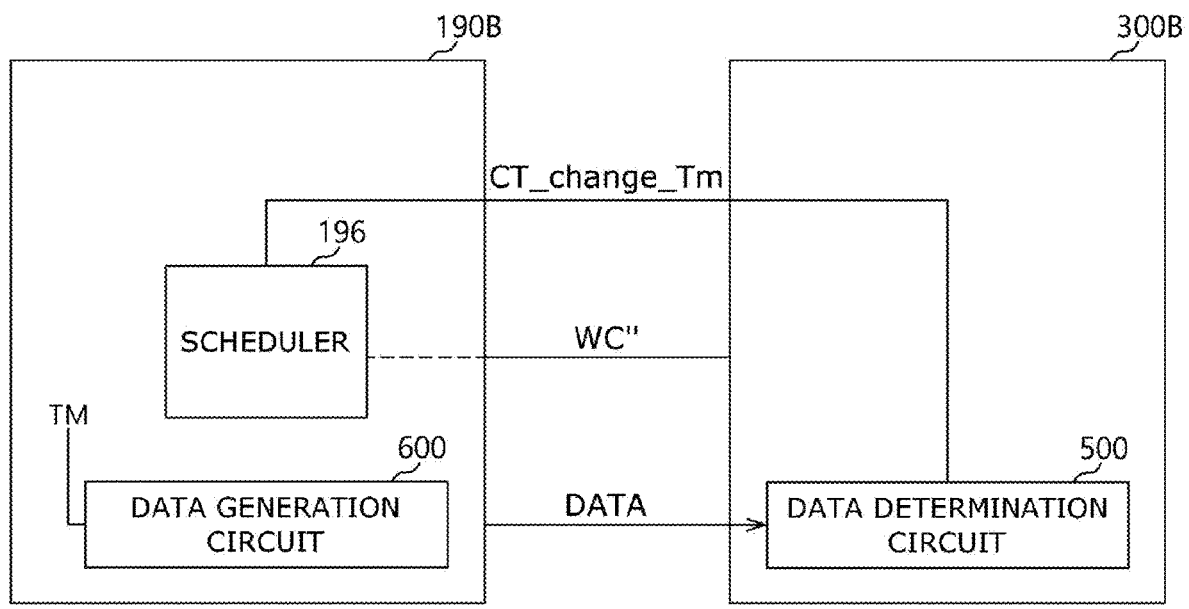
FIG. 30 is a block diagram illustrating a memory controller and a memory device in a semiconductor memory system according to still another embodiment of the present disclosure.

FIGS. 29 and 30 are a block diagram illustrating a memory controller and a memory device in a semiconductor memory system according to another embodiment.

Referring to FIG. 29, a semiconductor memory system 1000A may include a memory controller 190A configured to output a test mode signal TM and a memory device 300A configured to perform a test operation in response to the test mode signal TM.

To perform the test operation, the memory controller 190A may output the test mode signal TM in a command form to the memory device 300A.

The memory device 300A may include a data generation circuit 600 configured to generate data DATA<0:n> so that a set state or a reset state is written in each of the memory cells in response to the test mode signal TM. The memory device 300A may further include a data determination circuit 500, which receives the data DATA<0:n> generated by the data generation circuit 600 and generates a change signal CT_change_Tm for changing a crystallization timing according to levels of the data DATA<0:n>. The data determination circuit 500 may have any one configuration selected from among the configurations described in FIGS. 10, 11, 12, 17, 19, 23, and 25.

The memory controller 190A may include a scheduler 196 that outputs a write command WC", in order to perform the test operation in which a write recovery time is controlled in response to the change signal CT_change_Tm generated by the data determination circuit 500.

In this embodiment, the data generation circuit 600 is installed in the memory device 300B, but the data generation circuit 600 may be included in a memory controller 190B as illustrated in FIG. 30.

Figure 31:
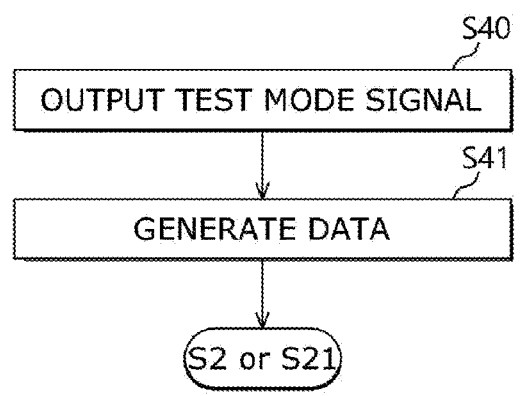
FIG. 31 is a flowchart illustrating a driving method of the semiconductor memory system illustrated in each of FIGS. 29 and 30 according to an embodiment of the present disclosure.

FIG. 31 is a flowchart illustrating a driving method of the semiconductor memory systems that are illustrated in FIGS. 29 and 30.

Referring to FIG. 31, the memory controller 190A or 190B may output the test mode signal TM to the data generation circuit 600, in order to test the memory device 300A or 300B (S40).

The data generation circuit 600 may generate data DATA<0:n>, which is suitable for the test operation, in response to the test mode signal TM (S41).

The data DATA<0:n> may be input to the data determination circuit 500, and the data determination circuit 500 may perform an operation (S2 or S21) to selectively change a write recovery time tWR of a write command according to states of the data DATA<0:n>.

According to an embodiment, when each of the data DATA<0:n> has the reset state or the set state, a write command generation period may be reduced based on a reset write recovery time tWR_R, and thus a write time of the memory device 300A or 300B may be reduced.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A semiconductor memory system comprising:
a memory controller including a scheduler configured to determine a generation period of a write command; and
a memory device including a memory cell array, the memory device being configured to write input data input from the memory controller in the memory cell array in response to the write command,
wherein the memory device further comprises a data determination circuit configured to output a change signal to the scheduler when all logic levels of the input data to be written in the memory cell array are the same, the scheduler changing the generation period of the write command in response to the change signal, each of the input data having one of a first logic level and a second logic level opposite to the first logic level,
wherein the data determination circuit is included in the memory device, and
wherein the data determination circuit includes a set determination circuit configured to output the change signal in response to a reset recovery time when each of the input data has the second logic level.

2. The semiconductor memory system of claim 1, wherein the data determination circuit includes a reset determination circuit configured to output the change signal in response to the reset recovery time when each of the input data has the first logic level.

3. The semiconductor memory system of claim 1, wherein data determination circuit further includes:

a signal selection circuit configured to transfer inverted input data to the memory cell array in response to the change signal output from the set determination circuit; and
an information storage circuit configured to store information indicating that the inverted input data has been transferred to the memory cell array in response to the change signal.

4. The semiconductor memory system of claim 1, wherein the data determination circuit includes a selective blocking circuit configured to, when the input data are currently input data, block the transfer of the currently input data to the memory cell array when previously input data stored in the memory cell array are identical with the currently input data.

5. The semiconductor memory system of claim 4, wherein the data determination circuit further includes:
a buffer circuit configured to temporarily store the previously input data; and
a comparison circuit configured to output a comparison signal by comparing the previously input data stored in the buffer circuit and the currently input data, and
wherein the selective blocking circuit is selectively driven in response to the comparison signal.

6. The semiconductor memory system of claim 1, wherein the scheduler includes a time selection circuit configured to receive a first write recovery time and a second write recovery time, and to output the write command with the second write recovery time when the change signal is enabled, the change signal being enabled when all the logic levels of the input data are equal to each other, the second write recovery time being shorter than the first write recovery time.

7. The semiconductor memory system of claim 6, wherein the scheduler further includes:
a timing check circuit configured to change the generation period of the write command based on a signal output from the time selection circuit; and
a command generation circuit configured to output the write command in response to an output signal of the timing check circuit.

8. The semiconductor memory system of claim 1, further comprising a data generation circuit configured to generate the input data having logic levels equal to each other in response to a test mode signal generated from the memory controller.

9. The semiconductor memory system of claim 8, wherein the data generation circuit is included in the memory device.

10. The semiconductor memory system of claim 8, wherein the data generation circuit is included in the memory controller.

11. A semiconductor memory system comprising:
a dual inline memory module (DIMM) including at least one phase-change memory module, the phase-change memory module being configured to have a set resistance state and a reset resistance state and to perform a memory operation; and
a memory controller configured to transfer a write command and input data to the phase-change memory module,
wherein the phase-change memory module comprises a data determination circuit configured to provide a change signal to the memory controller when all logic levels of the input data to be written in the phase-change memory module are the same, the memory controller controlling a generation period of the write command input to the phase-change memory module in response to the change signal, wherein the memory controller sets a default of the generation period of the write command to be a first crystallization time, the first crystallization time being a time the phase-change memory module takes to change into the set resistance state, and wherein the memory controller includes a scheduler configured to change the generation period of the write command to be a second crystallization time when the change signal is input, the second crystallization being a time the phase-change memory module takes to change into the reset resistance state.

12. The semiconductor memory system of claim 11, wherein the data determination circuit is included in a memory device.

13. A driving method of a semiconductor memory system, the method comprising:

providing input data to be written in a plurality of memory cells in a memory device, each of phase-change material layers in the plurality of memory cells being in any of a set resistance state and a reset resistance state when the input data is written in the plurality of memory cells; and setting a generation period of a write command based on a crystallization time when all logic levels of the input data have a logic level corresponding to the set resistance state, the crystallization time being a time the phase-change material layer takes to be in the reset resistance state, wherein the crystallization time of the reset resistance state is shorter than that of the set resistance state, wherein when each of the input data has the logic level corresponding to the set resistance state, inverted input data are written in the plurality of memory cells in the memory device, and wherein the method further comprises storing information indicating that the inverted input data have been stored in the plurality of memory cells.

* * * * *